(12) United States Patent
Morita et al.

(10) Patent No.: US 8,064,191 B2
(45) Date of Patent: Nov. 22, 2011

(54) CAPACITOR UNIT, AND ITS MANUFACTURING METHOD

(75) Inventors: Kazuki Morita, Osaka (JP); Tatehiko Inoue, Osaka (JP); Shusaku Kawasaki, Osaka (JP); Toshiyuki Kitagawa, Kyoto (JP); Tooru Ninomiya, Kyoto (JP)

(73) Assignee: Panasonic Corporation, Osaka (JP)

( * ) Notice: Subject to any disclaimer, the term of this patent is extended or adjusted under 35 U.S.C. 154(b) by 691 days.

(21) Appl. No.: 12/280,692

(22) PCT Filed: Mar. 13, 2007

(86) PCT No.: PCT/JP2007/054882
§ 371 (c)(1),
(2), (4) Date: Aug. 26, 2008

(87) PCT Pub. No.: WO2007/111117
PCT Pub. Date: Oct. 4, 2007

(65) Prior Publication Data
US 2009/0059470 A1    Mar. 5, 2009

(30) Foreign Application Priority Data

Mar. 16, 2006  (JP) ................. 2006-072328
Mar. 16, 2006  (JP) ................. 2006-072329
Jan. 15, 2007  (JP) ................. 2007-005624

(51) Int. Cl.
*H01G 2/20*     (2006.01)
*H01G 5/38*     (2006.01)
*H05K 7/18*     (2006.01)

(52) U.S. Cl. ............ 361/328; 361/308.1; 361/796; 361/541

(58) Field of Classification Search ........... 361/308.1, 361/328, 541, 522, 796–803
See application file for complete search history.

(56) References Cited

U.S. PATENT DOCUMENTS

| | | | | |
|---|---|---|---|---|
| 4,205,365 A * | 5/1980 | Kalina | ........ | 361/308.3 |
| 4,639,566 A * | 1/1987 | DeHaitre | ........ | 200/507 |
| 4,754,366 A * | 6/1988 | Hernandez | ........ | 361/306.2 |
| 5,253,143 A * | 10/1993 | Klinger et al. | ........ | 361/736 |
| 5,521,789 A * | 5/1996 | Ohannes et al. | ........ | 361/111 |
| 5,579,217 A * | 11/1996 | Deam et al. | ........ | 363/144 |
| 5,818,101 A * | 10/1998 | Schuster | ........ | 257/659 |
| 5,818,125 A * | 10/1998 | Manchester | ........ | 307/66 |
| 6,670,557 B2 * | 12/2003 | Gehrke et al. | ........ | 174/260 |
| 7,099,140 B2 * | 8/2006 | Janicek et al. | ........ | 361/306.3 |
| 2005/0213308 A1 * | 9/2005 | Suzuki et al. | ........ | 361/803 |

FOREIGN PATENT DOCUMENTS

| | | |
|---|---|---|
| JP | 2005-93758 | 4/2005 |
| JP | 2005-93759 | 4/2005 |
| JP | 2005-333041 | 12/2005 |

* cited by examiner

*Primary Examiner* — Eric Thomas
(74) *Attorney, Agent, or Firm* — Steptoe & Johnson LLP

(57) ABSTRACT

According to the configuration and the manufacturing method of forming a moisture proof agent on both surfaces of a circuit substrate after soldering a capacitor connection pin in a vertical direction to the circuit substrate, and electrically connecting the capacitor so as to be in a perpendicular direction to the length direction of the capacitor connection pin at the upper space of the circuit substrate, the possibility of the moisture proof agent attaching to the capacitor is eliminated, the productivity enhances since the moisture proof agent can be easily formed on both surfaces of the circuit substrate, and a capacitor unit of miniaturized and low height configuration is realized since the capacitor is mounted in the horizontal direction in the upper space with respect to the circuit substrate.

18 Claims, 19 Drawing Sheets

CAPACITOR UNIT, AND ITS MANUFACTURING METHOD

The present application is based on International Application PCT/JP2007/054882, filed Mar. 13, 2007, which claims priority to Japanese Patent Applications No. 2006-072328, filed Mar. 16, 2006; No. 2006-072329, filed Mar. 16, 2006; and No. 2007-005624, filed Jan. 15, 2007, the entire contents of which are hereby incorporated by reference.

TECHNICAL FIELD

The present invention relates to an emergency power source of electronic equipments using a battery and the like, and in particular, a capacitor unit used in an electronic brake system etc. for electrically braking a vehicle, and a method of manufacturing the same.

BACKGROUND ART

In recent years, development in hybrid cars and electric automobiles is advancing, and various proposals have been made from the conventional mechanical hydraulic control to the electrical hydraulic control with respect to the braking of the vehicle.

A battery is generally used for a power source to electrically perform hydraulic control of the vehicle, but in this case, the hydraulic control cannot be performed with only the use of the battery if supply of power is terminated for some reason, and braking of the vehicle may become impossible.

A proposal has been made to respond to an emergency by mounting a plurality of large-capacity capacitors etc. as an emergency auxiliary power source separate from the battery.

Patent document and the like are known as prior art documents related to the present application. An example of a capacitor configuring one portion of a capacitor unit is shown in an exploded perspective view of FIG. 23. As shown in FIG. 23, two lead wires 602 arranged on one end face of each of plurality of capacitors 601 are bending worked to a crank shape. The vibration of the vehicle thus can be absorbed even when applied to lead wire 602, and thus breaking is less likely to occur, and reliability enhances. Capacitor 601 is still disassembled at the stage of bending working lead wire 602. Thus, although it is difficult to recognize in FIG. 23, the lengths of two lead wires 602 are differed from each other so that the polarity of lead wire 602 can be distinguished.

Capacitor 601 in which the preparation for bending work of lead wire 602 is completed is placed in each lead wire hole 604 formed in circuit substrate 603 while paying attention not to be mistaken the polarity. Although not shown in circuit substrate 603, a circuit component for electrically controlling capacitor 601 such as charging/discharging circuit and state detection circuit of capacitor 601 may be mounted in advance.

Capacitor 601 is then placed on holder 605 made of resin. Here, ribs and elastic portions are arranged inside the capacitor placement hole of holder 605, although not shown, and the body of capacitor 601 is held and fixed thereby.

After placing capacitor 601, four screws (not shown) are tightened to boss 607 integrally molded with holder 605 through circuit substrate screw hole 606 to fix circuit substrate 603 to holder 605.

Capacitor 601 and circuit substrate 603 are fixed to holder 605 at this point, and all the extra portions of two lead wires 602 which lengths are differed to distinguish the polarity are cut. Furthermore, two lead wires 602 of each capacitor 601 are all soldered to be electrically connected to circuit substrate 603.

As lead wire 602 is soldered after fixing capacitor 601 and circuit substrate 603 to holder 605, stress on the solder connected portion in time of assembly due to the soldering before fixation is not applied, and the reliability can be enhanced.

Lastly, moisture proof agent is formed on both surfaces of circuit substrate 603. The moisture proof agent is in liquid form, and is formed to a film-form after being hardened and thus is not shown in FIG. 23. The moisture proof agent has a function of preventing, in particular, short-circuit failure etc. due to attachment of moisture to the adjacent soldered portion. The moisture proof agent is thus formed so as to cover the soldered portion after all the soldering is finished. A severe in-vehicle environment then can be responded.

The method of forming the moisture proof agent on circuit substrate 603 is as described below. First, with respect to an upper surface side of circuit substrate 603 in FIG. 23, the assembled capacitor unit is turned upside down, and a lower surface (back surface in this case) of circuit substrate 603 is adhered to the liquid level in a liquid bath (hereinafter also referred to as moisture proof agent bath) filled with moisture proof agent. The moisture proof agent is thereby easily formed over the entire back surface of circuit substrate 603.

The entire capacitor unit can be immersed in the moisture proof agent to form the moisture proof agent on both surfaces of circuit substrate 603 all at once. However, if the moisture proof agent attaches to a bottom surface (surface with lead wire 602) of capacitor 601 mounted on circuit substrate 603, the bottom surface will corrode and capacitor 601 will break. Therefore, the method of immersing the entire capacitor unit in the moisture proof agent cannot be used.

When forming the moisture proof agent on a mounting surface (front surface) of capacitor 601 of circuit substrate 603, the moisture proof agent is applied with a dispenser etc. to the peripheral portion not mounted with capacitor 601 and the circuit components in circuit substrate 603, and thereafter, the capacitor unit is tilted to various angles and directions so that the moisture proof agent spreads over the entire front surface of circuit substrate 603. The moisture proof agent thus even forms at a central part of circuit substrate 603 where capacitor 601 is tightly packed.

The moisture proof agent is formed on both surfaces of circuit substrate 603 through the above steps, and the capacitor unit is completed.

The capacitor unit of such configuration can actually be used well as an auxiliary power source for vehicle braking from the aspects of vehicle vibration, enhancement in reliability of the soldered portion by moisture proof agent, and the like.

However, the formation of the moisture proof agent on the surface mounted with capacitor 601 of circuit substrate 603 is a complicated and difficult step. Furthermore, thickness of the moisture proof agent may vary after forming the moisture proof agent, and the configuration has an extremely bad productivity.

Moreover, since capacitor 601 is mounted in a vertical direction, the capacitor unit becomes higher or greater than or equal to the length of capacitor 601, and the installable location in a restricted vehicle space becomes limited. Therefore, miniaturization and lower height are necessary to enhance the degree of freedom of installation.

[Patent document 1] Unexamined Japanese Patent Publication No.

DISCLOSURE OF THE INVENTION

A capacitor unit of the present invention forms a moisture proof agent on both surfaces of a circuit substrate after soldering a capacitor connection pin in a vertical direction to the circuit substrate. A configuration and a manufacturing method of electrically connecting the capacitor so as to be in a perpendicular direction to the length direction of the capacitor connection pin at the upper space of the circuit substrate are provided.

The possibility of the moisture proof agent attaching to the capacitor is eliminated since the moisture proof agent is formed before connecting the capacitor. The moisture proof agent can be easily formed on both surfaces of the circuit substrate. Furthermore, a capacitor unit of miniaturized and low height configuration is realized since the capacitor is mounted in the horizontal direction in the upper space with respect to the circuit substrate.

Figure 1A:
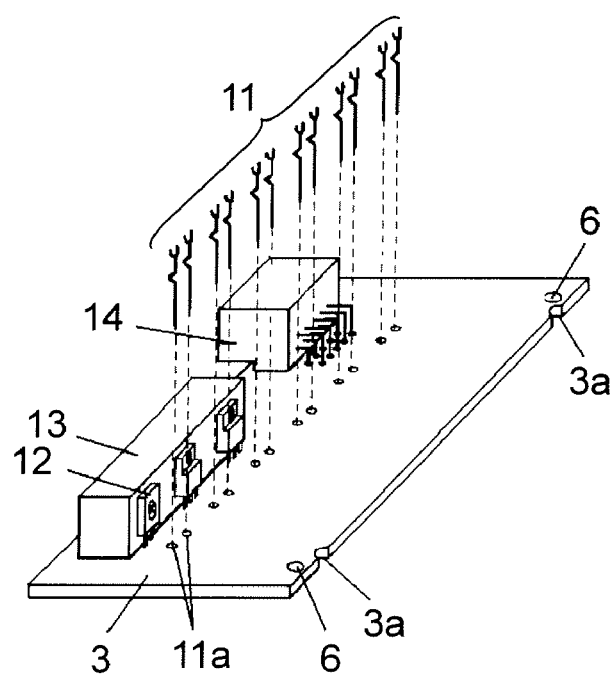
FIG. 1A is an exploded perspective view of an entire circuit substrate of a capacitor unit according to a first embodiment of the present invention.

DESCRIPTION OF REFERENCE MARKS 1, 211, 401 capacitor
2, 213, 402 lead wire
3, 217, 403 circuit substrate
3a positioning concave part
3b circuit substrate fixing hole
3c integrated capacitor connection pin attachment hole
4, 219, 404 lead wire hole
5, 229, 405 holder
5a, 405a semi-cylindrical elastic portion
5c, 405c seat
5d, 405d space
5e, 259, 405e rib
11 capacitor connection pin
11b capacitor connecting portion
11c circuit substrate placement portion
11d convex portion
11e capacitor connection pin step difference
11f intermediate portion
11g bent portion
11h step difference tapered portion
11i cut portion
14, 225 connector
14a jig connector
15 fixing jig
16 moisture proof agent bath
17b moisture proof agent
18b, 227, 415 base part
19, 231, 416 circuit substrate fixing part
19a positioning projection
19b, 416a circuit substrate fixing projection
19c, 416b circuit substrate fixing catch portion
19d, 416c inclined portion
20, 417 elastic projection
21, 406a screw
21a snap
23, 239, 420 case
23a, 253 circuit substrate contacting portion
23b, 255 case inclined portion
24, 421 case fixing catch part
25, 241 connector hole
26 base part placement port
27 groove
28, 249 lock part
29, 257 tapered portion
30 integrated capacitor connection pin
30b capacitor connection pin projection
30c convex part
215 bent portion
233 elastic projection
237 case fixing catch part
243 circuit substrate placement part
245 circuit substrate end
247 fixing part
251 distal end
261 case inclined portion
263 thin thickness portion
265 circuit substrate inclined portion
267 rear end
402a bent portion
403b circuit substrate fixing hole
414 connector
416e positioning projection

DETAILED DESCRIPTION OF PREFERRED EMBODIMENTS

The preferred embodiments for implementing the present invention will be hereinafter described with reference to the drawings.

First Embodiment

Figure 1B:
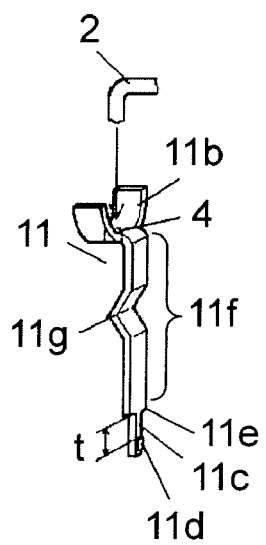
FIG. 1B is a perspective view of a first example of a capacitor connection pin of the capacitor unit according to the first embodiment of the present invention.
Figure 1C:
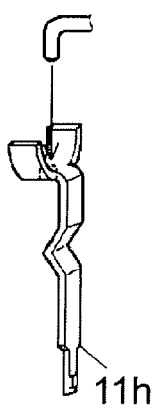
FIG. 1C is a perspective view of a second example of the capacitor connection pin of the capacitor unit according to the first embodiment of the present invention.
Figure 1D:
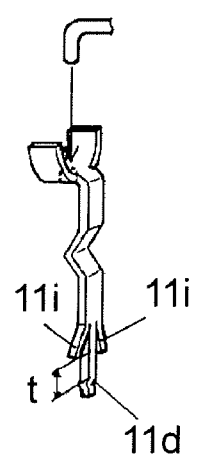
FIG. 1D is a perspective view of a third example of the capacitor connection pin of the capacitor unit according to the first embodiment of the present invention.

FIG. 1A is an exploded perspective view of entire circuit substrate 3 of a capacitor unit according to a first embodiment of the present invention. FIG. 1B is a perspective view of a first example of capacitor connection pin 11 of the capacitor unit according to the first embodiment of the present invention. FIG. 1C is a perspective view of a second example of capacitor connection pin 11 of the capacitor unit according to the first embodiment of the present invention. FIG. 1D is a perspective view of a third example of capacitor connection pin 11 of the capacitor unit according to the first embodiment of the present invention.

Figure 4A:
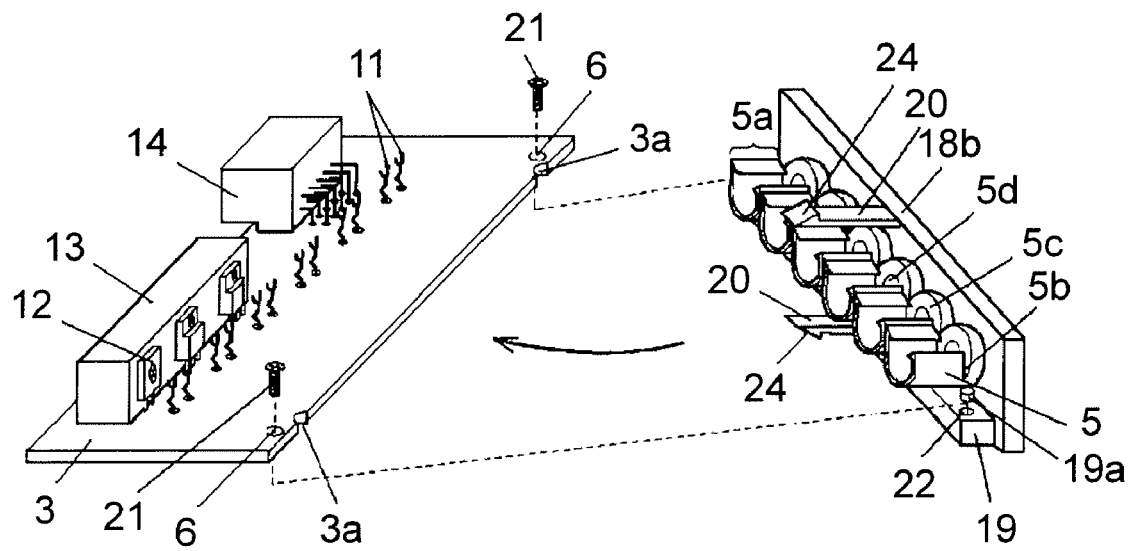
FIG. 4A is an exploded perspective view showing a method of placing circuit substrate to the base part of the capacitor unit according to the first embodiment of the present invention.
Figure 4B:
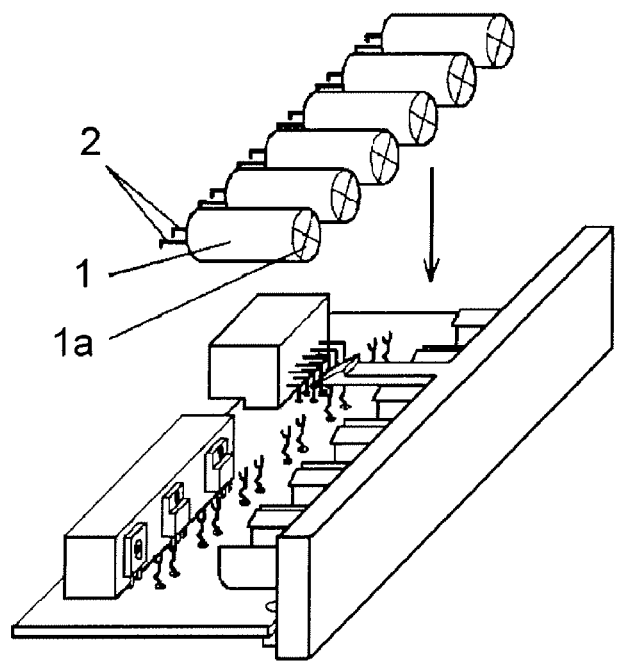
FIG. 4B is a perspective view showing the circuit substrate and the capacitor mounting method to the base part of the capacitor unit according to the first embodiment of the present invention.

As shown in FIG. 1A, twelve capacitor connection pins 11, which is twice the quantity of capacitor 1 to be hereinafter described, are placed and fixed in a vertical direction in capacitor connection pin hole 11a in circuit substrate 3. In the first embodiment, the quantity of capacitor 1 is six, as shown in FIG. 4B. The detailed structure of capacitor connection pin 11 will be described with reference to FIGS. 1B and 1C.

Capacitor connection pin 11 is made of copper, and is worked to the shape shown in FIG. 1B. Capacitor connection pin 11 is provided with satisfactory workability by being made of copper, and thus can be easily formed by pressing etc., and the productivity enhances. Compared to lead wire 2 which core material is made of iron, the specific resistance is small or about ⅙ since capacitor connection pin 11 is made of copper. Therefore, the internal resistance of each capacitor 1 can be reduced by shortening lead wire 2 by the length of capacitor connection pin 11. The front surface of capacitor connection pin 11 may be formed with a plated layer of tin and the like to prevent corrosion and to enhance reliability.

The upper part of capacitor connection pin 11 is formed with capacitor connecting portion 11b for connecting lead wire 2 of capacitor 1. Capacitor connecting portion 11b is worked so that the cross section becomes U-shaped with respect to the length direction (direction seen from the right side in FIG. 1B) of lead wire 2. The cross section may be V-shaped. Lead wire 2 can be easily connected to capacitor connecting portion 11b by forming capacitor connecting portion 11b to such shape, and thus the productivity enhances.

Lead wire hole 4 or a pass-through hole is formed at the bottom part of capacitor connecting portion 11b. The distal end of lead wire 2 subjected to bending work and cutting work, as hereinafter described, is placed therein. The distal end of lead wire 2 is cut to a predetermined length slightly longer than the length of lead wire hole 4 so that lead wire 2 can be reliably placed. Therefore, the distal end of lead wire 2 is reliably fixed to capacitor connecting portion 11b, and connection thereof by soldering is facilitated. As a result, the productivity further enhances.

Circuit substrate placement portion 11c is formed at the lower end of capacitor connecting portion 11b. The size of circuit substrate placement portion 11c is a dimension smaller than capacitor connection pin hole 11a formed in circuit substrate 3. However, capacitor connection pin 11 will freely move when circuit substrate placement portion 11c is placed in capacitor connection hole 11a if circuit substrate placement portion 11c is simply formed to a small dimension. As a result, capacitor connecting portion 11b may not be fixed in the direction of lead wire 2. Convex portion 11d is thus arranged at one part on circuit substrate placement portion 11c. Furthermore, capacitor connection pin step difference 11e is formed at a position of a spacing t substantially equal to the thickness of circuit substrate 3 in a height direction (upward direction in FIG. 1B) from the upper end of convex portion 11d. Thus, when circuit substrate placement portion 11c is placed in capacitor connection pin hole 11a, circuit substrate 3 will be sandwiched by convex portion 11d and capacitor connection pin step difference 11e. Therefore, capacitor connection pin 11 cannot freely move once placed in capacitor connection pin hole 11a.

A predetermined number of capacitor connection pins 11 is placed in capacitor connection pin hole 11a sequentially or all at once with a fixed jig so that capacitor connecting portion 11b is directed in the direction of lead wire 2. Capacitor connection pin 11 can be fixed to circuit substrate 3 with the directions aligned. Furthermore, capacitor connection hole 11a is formed in circuit substrate 3 and capacitor connection pin 11 is mounted thereon such that capacitor connecting portion 11b is at the position corresponding to the distal end of lead wire 2 when holding capacitor 1 with holder 5, as shown in FIGS. 4A and 4B. Thus, lead wire 2 is placed in lead wire hole 4 without contacting the upper end etc. of capacitor connecting portion 11b in the attachment step of capacitor 1 to be hereinafter described, and the productivity enhances.

As shown in FIG. 1B, the height of intermediate portion 11f excluding circuit substrate placement portion 11c and capacitor connecting portion 11b of capacitor connection pin 11 is substantially equal to the height from front surface of circuit substrate 3 to lead wire 2 when capacitor 1 is placed and fixed to holder 5. Thus, the distal end of lead wire 2 exactly reaches capacitor connecting portion 11b when capacitor 1 is fixed to holder 5, and the length of lead wire 2 having high specific resistance can be shortened to a minimum.

Bent portion 11g is formed at intermediate portion 11f of capacitor connection pin 11. This may be "dogleg" shape as shown in FIG. 1B or may be U-shape. The placing direction of capacitor connection pin 11 to capacitor connection pin hole 11a thus can be easily determined, and the productivity enhances. As stress on lead wire 2 and capacitor connection pin 11 due to vibration from the vehicle and temperature change can be absorbed by bent portion 11g, high reliability is also obtained.

As shown in FIG. 1C, step difference tapered portion 11h may be formed at capacitor connection pin step difference 11e. Capacitor connection pin 11 then can always be placed at the center of capacitor connection pin hole 11a by step difference tapered portion 11h even if there is tolerance between the diameter of capacitor connection pin hole 11a and circuit substrate placement portion 11c, and thus displacement of lead wire 2 and capacitor connection portion 11b can be reduced, and the productivity further enhances.

Furthermore, cut portion 11i may be formed at one part of intermediate portion 11f as capacitor connection pin step difference 11e. Thus, when placing capacitor connection pin 11 in capacitor connection pin hole 11a of circuit substrate 3, cut portion 11i at two locations contact circuit substrate 3, and the possibility of tilting can be reduced compared to capacitor connection pins 11 of FIGS. 1B and 1C. As a result, the connection with lead wire 2 is further facilitated, and the productivity is enhanced.

Convex portion 11d may be subjected to bending work to "dogleg" shape etc. similar to bent portion 11g, as shown in FIG. 1D. The formation of convex portion 11d is thereby facilitated. In this case, the spacing between cut portion 11i and convex portion 11d is set to be substantially equal to thickness t of circuit substrate 3 at the position shown in FIG. 1D.

Returning back to FIG. 1A, the mounting components to circuit substrate 3 other than capacitor connection pin 11 will be described. As shown in FIG. 1A, circuit components other than capacitor 1 (not shown) such as circuit components for electrically controlling capacitor 1 including charging/discharging circuit, state detection circuit and the like are soldered and mounted beforehand. Among them, heat generating component 12 such as FET is mounted while being attached to heat sink 13. The heat generation of heat generating component 12 is thereby suppressed. Heat sink 13 is fixed to circuit substrate 3 with screws (not shown).

Connector 14, which is either a set of male connectors or female connectors is mounted at the end on the left side of circuit substrate 3 as a moisture proof agent non-attachable component as shown in FIG. 1A. Connector 14 is mounted on the extension (on left side in FIG. 1A) in the length direction of capacitor 1 at the end of circuit substrate 3. The terminal of connector 14 is mounted to be on the left side of circuit substrate 3 as in FIG. 1A. Thus, connector 14 is mounted such that the terminal is on the placing direction to case 23 (hereinafter described with reference to FIG. 6) of circuit substrate 3. Connector 14 is partially fixed to circuit substrate 3 with screws (not shown). The illustration of other circuit components is omitted in FIG. 1A.

Furthermore, circuit substrate 3 is formed with circuit substrate screw hole 6 at two locations for fixation to circuit substrate fixing part 19 of base part 18b to be hereinafter described with reference to FIGS. 4A and 4B, and is formed with positioning concave part 3a at two locations in the vicinity of circuit substrate screw hole 6. Positioning concave part 3a is arranged at the position corresponding to positioning projection 19a integrally formed on circuit substrate fixing part 19. Therefore, when fixing circuit substrate 3 to circuit substrate fixing part 19, positioning projection 19a is placed in positioning concave part 3a. As a result, the positions of circuit substrate screw hole 6 and base part screw hole 22 coincide, whereby screw-tightening becomes extremely easy, and the productivity enhances.

Some circuit components break or cause contact failure when the moisture proof agent attaches such as electrolytic capacitor and connector 14. When the moisture proof agent enters the boundary of heat generating component 12 and heat sink 13, heat conduction from heat generating component 12 to heat sink 13 becomes insufficient, and heat generating component 12 degrades and breaks. Such moisture proof agent non-attachable component is thus arranged and mounted near the end of one arbitrary side (left side of circuit substrate 3 in FIG. 1A) of circuit substrate 3. Furthermore, in the first embodiment, the moisture proof agent non-attachable component is mounted only on one surface (front surface in FIG. 1A) of circuit substrate 3. The reasons therefor will be hereinafter described.

Figure 2:
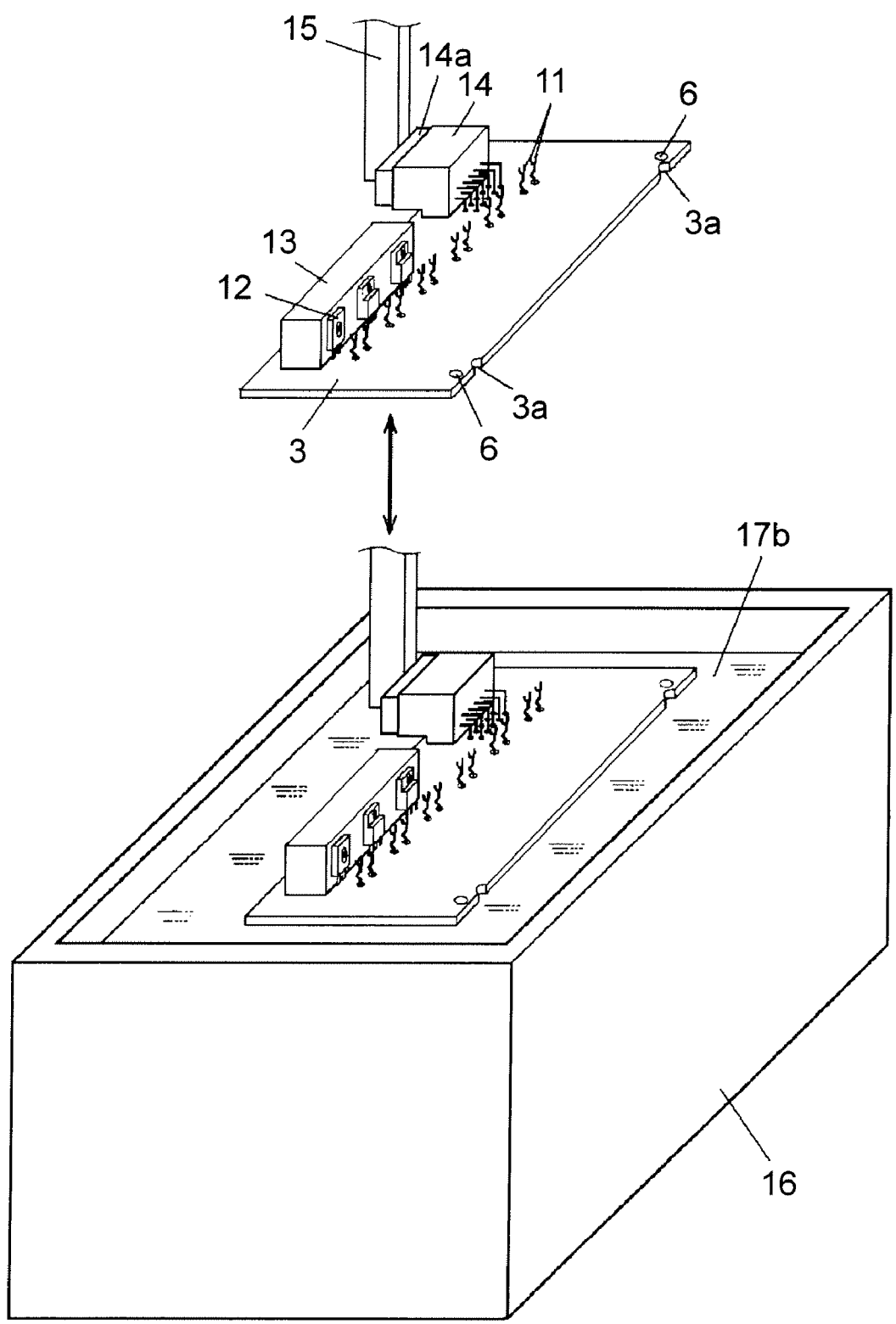
FIG. 2 is a perspective view showing a method of forming moisture proof agent on the back surface of the circuit substrate of a method of manufacturing the capacitor unit according to the first embodiment of the present invention.

After the circuit components other than capacitor 1 are mounted at predetermined positions by soldering and screw-fitting, the moisture proof agent is formed at the soldered portion of both surfaces of circuit substrate 3. The manufacturing method thereof will be described hereinafter with reference to FIG. 2. FIG. 2 is a perspective view showing a method of forming moisture proof agent 17b on the back surface of circuit substrate 3 of a method of manufacturing the capacitor unit according to the first embodiment of the present invention.

First, jig connector 14a (other connector corresponding to connector 14) is fitted with connector 14 as shown in the upper view of FIG. 2. Jig connector 14a is connected with fixing jig 15, and is also attached to a movement part (not shown) for moving circuit substrate 3. Therefore, circuit substrate 3 can be held and moved by fitting the set of connectors (connector 14 and jig connector 14a). A state in which connector 14 and jig connector 14a are fitted to circuit substrate 3 is shown in the upper view of FIG. 2.

In the first embodiment, the non-attachable components of moisture proof agent 17b as described above are mounted only on one surface (front surface in FIG. 2) of circuit substrate 3, and thus circuit substrate 3 is first held horizontal by the movement part connected to fixing jig 15 by way of jig connector 14a. Circuit substrate 3 is then moved downward in FIG. 2 with the movement part, so that only the entire surface of circuit substrate 3 on the surface side (back surface in FIG. 2) not mounted with non-attachable components of moisture proof agent 17b is adhered to the liquid level of moisture proof agent 17b stored in moisture proof agent bath 16. Here, circuit substrate 3 is correctly moved by the movement part so that the liquid level of moisture proof agent 17b does not reach the front surface of circuit substrate 3.

Circuit substrate 3 is then moved upward in FIG. 2 by the movement part, and moisture proof agent 17b attached to the back surface of circuit substrate 3 is hardened. The moisture proof agent 17b is thereby formed over the entire back surface of circuit substrate 3.

Figure 3A:
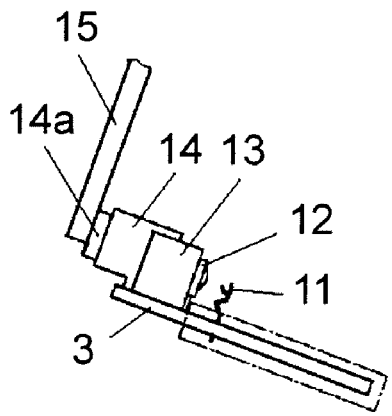
FIG. 3A is a partial cross sectional view showing the method of forming the moisture proof agent on the front surface of the circuit substrate of the method of manufacturing the capacitor unit according to the first embodiment of the present invention, and is a side view of the circuit substrate before formation of moisture proof agent.
Figure 3B:
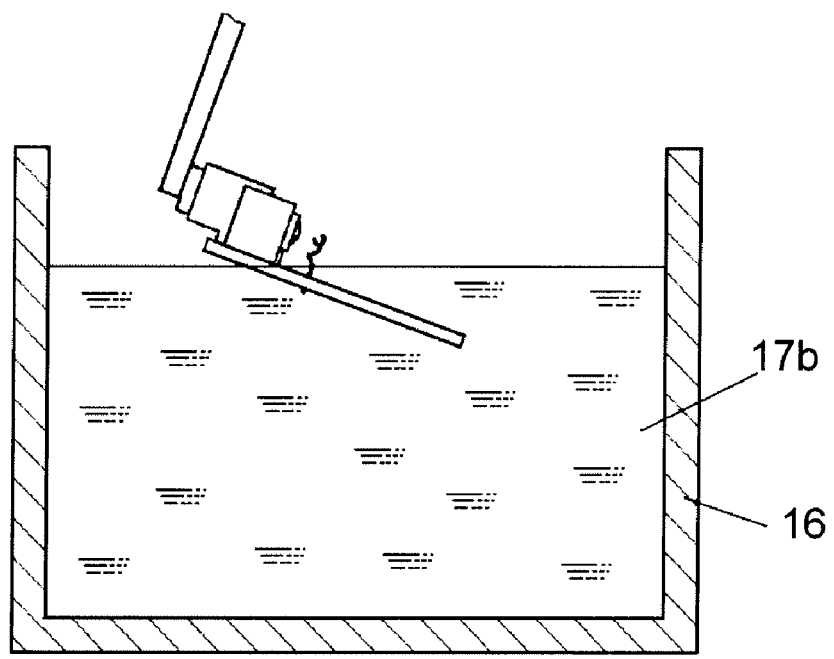
FIG. 3B is a view showing an immersed state of the circuit substrate in the moisture proof agent bath of the capacitor unit according to the first embodiment of the present invention.
Figure 3C:
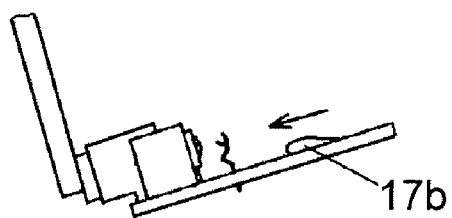
FIG. 3C is a side view of the circuit substrate in time of formation of the moisture proof agent on the non-attachable components of the moisture proof agent of the capacitor unit according to the first embodiment of the present invention.

The method of forming moisture proof agent 17b on the front surface of circuit substrate 3 will be described below with reference to FIGS. 3A, 3B, and 3C. FIG. 3A is a partial cross sectional view showing the method of forming moisture proof agent 17b on the front surface of circuit substrate 3 of the method of manufacturing the capacitor unit according to the first embodiment of the present invention, and is a side view of circuit substrate 3 before formation of moisture proof agent 17b. FIG. 3B is a view showing an immersed state of circuit substrate 3 in moisture proof agent bath 16 of the capacitor unit according to the first embodiment of the present invention. FIG. 3C is a side view of circuit substrate 3 in time of formation of moisture proof agent 17b on the non-attachable components of moisture proof agent 17b of the capacitor unit according to the first embodiment of the present invention. First, circuit substrate 3 is rotated and tilted in a clockwise direction from the horizontal direction by way of fixing jig 15 through the movement part (not shown), as shown in FIG. 3A. Circuit substrate 3 is then held such that the non-attachable components of moisture proof agent 17b are on the upper side.

Circuit substrate 3 is then moved downward by the movement part from this state, as shown in FIG. 3B, so that circuit substrate 3 is immersed in moisture proof agent 17b to immediately close to non-attachable components of moisture proof agent 17b (range indicated with a chain dashed line of FIG. 3A). Here, circuit substrate 3 is accurately moved by the movement part so that liquid level of moisture proof agent 17b does not reach the non-attachable components of moisture proof agent 17b of circuit substrate 3.

Thereafter, circuit substrate 3 is moved to above moisture proof agent 17b shown in FIG. 3B by the movement part. Moisture proof agent 17b may be applied with a dispenser to the left side of circuit substrate 3 of FIG. 3A, for example, to be separately formed at the soldered portion of the non-attachable components of moisture proof agent 17b, but moisture proof agent 17b is formed at the soldered portion of non-attachable components of moisture proof agent 17b through the following method herein.

After circuit substrate 3 is sufficiently spaced apart from liquid level of moisture proof agent 17b in FIG. 3B, circuit substrate 3 is immediately tilted to the non-attachable component side (left side of FIG. 3C) of moisture proof agent 17b as shown in FIG. 3C. Specifically, circuit substrate 3 is rotated in the counterclockwise direction by the movement part. As a result, moisture proof agent 17b already attached to the portion immersed in moisture proof agent 17b (range indicated with the chain dashed line of FIG. 3A) flows in a direction indicated with an arrow in FIG. 3C, that is, towards the soldered portion of the non-attachable components of moisture proof agent 17b by gravity. Moisture proof agent 17b thereby forms at the soldered portion of the non-attachable components of moisture proof agent 17b.

Here, the distance moisture proof agent 17b flows to the soldered portion of the non-attachable components of moisture proof agent 17b is extremely short compared to the distance of when applying moisture proof agent 17b to the periphery of the front surface of circuit substrate 3 with the dispenser and tilting circuit substrate in various angles and directions. In the first embodiment, circuit substrate 3 merely needs to be tilted to one side or the left side of circuit substrate 3, and thus the productivity enhances, the thickness variation of moisture proof agent 17b is reduced to a large extent, and even film-form moisture proof agent 17b can be formed.

A configuration of fitting jig connector 14a to connector 14 and attaching moisture proof agent 17b is adopted, where even in the event moisture proof agent 17b flowed by tilting circuit substrate 3 as in FIG. 3C enters inside connector 14, the terminal of connector 14 will be protected by jig connector 14a. Therefore, failures such as contact failure due to attachment of moisture proof agent 17b on the terminal are prevented.

Therefore, by moving circuit substrate 3, and performing the operations of forming moisture proof agent 17b on circuit substrate 3 (attaching and immersing operation of moisture proof agent 17b, tilting and upward and downward moving operations of circuit substrate 3, etc.) using the movement part, such operations can be accurately and automatically performed, and the productivity and the yield enhance to a large extent. Therefore, the non-attachable components of moisture proof agent 17b are mounted only at the end on one side and on one surface of circuit substrate 3 due to the reasons in such forming operations.

After being attached to all the soldered portions including the non-attachable components of moisture proof agent 17b, moisture proof agent 17b is hardened similar to the back surface thereby forming moisture proof agent 17b entirely over both surfaces of circuit substrate 3.

According to such method of forming moisture proof agent 17b, moisture proof agent 17b can be formed very easily and at an even thickness including the soldered portion of the non-attachable components of moisture proof agent 17b on both surfaces of circuit substrate 3, and thus the productivity enhances and the reliability with respect to moisture resistance also enhances.

As circuit substrate 3 is completed through the manufacturing method described above, attachment of circuit substrate 3 to base part 18b and mounting of capacitor 1 will be described with reference to FIGS. 4A and 4B. FIG. 4A is an exploded perspective view of a first example of the capacitor unit according to the first embodiment of the present invention, and is a perspective view showing a method of placing circuit substrate to base part 18b. FIG. 4B is a perspective view showing the circuit substrate and a capacitor mounting method to base part 18b of the capacitor unit according to the first embodiment of the present invention.

Completed circuit substrate 3 is attached to base part 18b as shown in FIG. 4A. The details of base part 18b will be described below. Base part 18b is formed by injection molding resin, and is integrally formed with holder 5 of capacitor 1, circuit substrate fixing part 19, positioning projection 19a, elastic projection 20, and the like.

First, as shown in FIGS. 4A and 4B, holder 5 includes semi-cylindrical elastic portion 5a which inner diameter is slightly larger than the outer diameter of capacitor 1. Therefore, holder 5 has a structure lying along the outer periphery (for semi-circle herein) of capacitor 1. Capacitor 1 is held by being fitted from above in FIG. 4A, where the distal end of elastic portion 5a has a structure such that the cross section is a tapered shape to securely fix capacitor 1. Cutout portion 5b is formed on base part 18b side of elastic portion 5a. Thus, when capacitor 1 is fitted in elastic portion 5a, capacitor 1 is fixed at the bottom part of holder 5 while widening the distal end of elastic portion 5a. In this case, the lower side of the tapered shape of elastic portion 5a contacts capacitor 1 by elasticity, and thus capacitor 1 is securely fixed at a total of three locations of the bottom part of holder 5, and the lower side of the tapered shape of elastic portion 5a. The tolerance of capacitor 1 and holder 5 can be absorbed according to such configuration, and thus capacitor 1 can be reliably fixed.

Plurality of capacitors 1 each has two lead wires at one end face. Seat 5c connected to elastic portion 5a is arranged so that the distal end side or the other end face side not arranged with the lead wire of capacitor 1 does not contact base part 18b when placing capacitor 1 in elastic portion 5a. Furthermore, in seat 5c, space 5d of concave shape is formed at the middle of seat 5c so that even in an event explosion proof valve 1a shown in FIG. 4B arranged at the distal end side (side surface without lead wire 2) of capacitor operates, such operation is not inhibited. Thus, capacitor 1 can be easily held at a normal position by placing the distal end side of capacitor 1 at elastic portion 5a along seat 5c, and furthermore, operation of explosion proof valve 1a can be performed since explosion proof valve 1a on the distal end side of capacitor 1 exactly faces space 5d when capacitor 1 is fitted in elastic portion 5a. Moreover, since leaked electrolytic solution retains in space 5d, the electrolytic solution does not attach to circuit substrate 3 and high reliability is obtained. If held such that the distal end side of capacitor 1 directly contacts base part 18b, explosion proof valve 1a cannot operate, and thus the operation space of explosion proof valve 1a such as space 5d described above needs to be ensured. Therefore, the structure is not limited to the above as long as the operation space of explosion proof valve 1a can be ensured.

Therefore, according to the structure of holder 5 shown in FIG. 4A, capacitor 1 can be securely fixed at a normal position by simply being fitted, the productivity is enhanced, the leakage of electrolytic solution is prevented, and reliability is enhanced.

Circuit substrate fixing part 19 is integrally formed so as to project out from the vicinity of the lower end of base part 18b. Positioning projections 19a are integrally formed at the positions corresponding to positioning concave parts 3a at two locations of circuit substrate 3 on both ends of the upper part of circuit substrate fixing part 19, and base part screw hole 22 for fixing circuit substrate 3 with screw 21 is integrally formed in the vicinity of positioning projection 19a. Screw 21 is screw fixed to base part screw hole 22 through circuit substrate screw hole 6 formed in circuit substrate 3 as shown with a dotted line. In this case, positioning projection 19a is placed in positioning concave part 3a as described above, and thus the positioning of circuit substrate 3 and base part 18b becomes extremely easy, and the productivity enhances.

Elastic projection 20 is a portion for fixing base part 18b fixed with circuit substrate 3 and case 23 to be hereinafter described with reference to FIG. 6, where the distal end thereof is integrally formed with case fixing catch part 24 of tapered shape as shown in FIG. 4A. In the first embodiment, elastic projection 20 is formed at two locations of upper and lower portion of base part 18b, and thus base part 18b and case 23 are fixed at two locations.

A method of fixing circuit substrate 3 to base part 18b will be described. First, in FIG. 4A, positioning projection 19a is placed in positioning concave part 3a of circuit substrate 3 from the direction of the arrow. The positions of circuit substrate screw hole 6 and base screw hole 22 at two locations thereby coincide, and screw 21 is tightened and fixed thereto. In the first embodiment, fixation is carried out at two locations, but may be at more locations.

A method of mounting capacitor 1 will now be described. First, as shown in FIG. 4B, plurality of capacitors 1 include electrical double layer capacitor of cylindrical shape. Two lead wires 2 are arranged at one end face (left side surface in FIG. 4B) of each capacitor 1. Two lead wires 2 are bending worked in advance so that the polarities are in the same direction. That is, lead wire 2 in capacitor 1 of FIG. 4B is performed with bending work so that the distal end of lead wire 2 becomes perpendicular to the length direction of capacitor 1 while being aligned such that lead wire 2 on the near side (left side when seen from above capacitor 1) is positive pole, lead wire 2 on the far side (right side when seen from above capacitor 1) is negative pole.

If the distal end of lead wire 2 is bent so as to be perpendicular to the length direction of capacitor 1, the polarity can always be distinguished, and thus lead wire 2 does not need to be formed to different lengths according to polarity as in the prior art. The distal ends of two lead wires 2 are cut to a predetermined length in advance. The predetermined length is the length of slightly projecting out from lead wire hole 4 when capacitor 1 is placed in lead wire hole 4 of FIGS. 1B and 1C.

Each capacitor 1 is sequentially placed in holder 5 from the direction shown with the arrow in FIG. 4B. The distal end of lead wire 2 is cut uniformly so as to be exactly placed in lead wire hole 4, and thus can be extremely easily placed.

Finally, each lead wire 2 and capacitor connection portion 11b are soldered and electrically connected. As a result, capacitor 1 is electrically connected so as to be in a direction perpendicular to the length direction of capacitor connection pin 11. The soldering task is facilitated to a large extent since the distal end of lead wire 2 is placed in lead wire hole 4, the solder of large surface tension is accommodated within the U-shape or the V-shape since the cross section seen from lead wire 2 side of capacitor connecting portion 11b is U-shaped or V-shaped, and soldering is further facilitated. The productivity enhances from this standpoint.

The connection of lead wire 2 and capacitor connecting portion 11b is not limited to soldering, and may be other connecting methods.

Since soldering is performed after placing capacitor 1, soldering can be carried out in a state stress in time of assembly does not apply on lead wire 2, and thus high reliability can also be obtained.

Furthermore, a circuit pattern in which at least capacitor 1 is connected in series, in parallel, or in series parallel is formed in circuit substrate 3, and capacitor 1 is connected so as to be one of the circuits by performing soldering. In the first embodiment, six capacitors 1 are arranged in series.

Up to the mounting of capacitor 1 is completed in the above manner, but the distal end of lead wire 2 needs to be placed in lead wire hole 4 of capacitor connection pin 11 since polarities are distinguished by bending the distal end of lead wire 2 in the perpendicular direction. Therefore, in the first embodiment, an assembly order of placing capacitor 1 after fixing circuit substrate 3 to circuit substrate fixing part 19 is adopted.

Figure 5A:
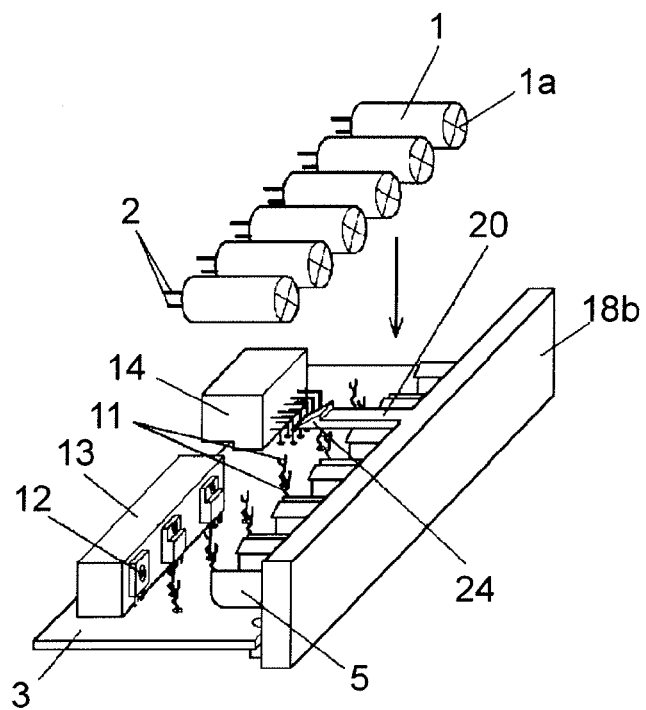
FIG. 5A is a partially exploded perspective view of a capacitor unit of another example according to the first embodiment of the present invention where the lengths of the two lead wires are different.
Figure 5B:
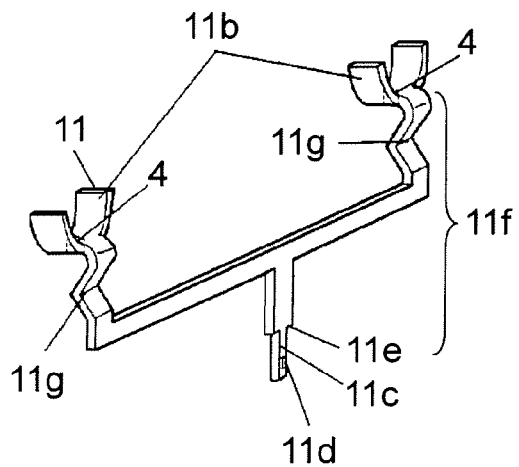
FIG. 5B is a perspective view of a capacitor connection pin including a capacitor connecting portion at two locations in a capacitor unit of another example according to the first embodiment of the present invention.
Figure 5C:
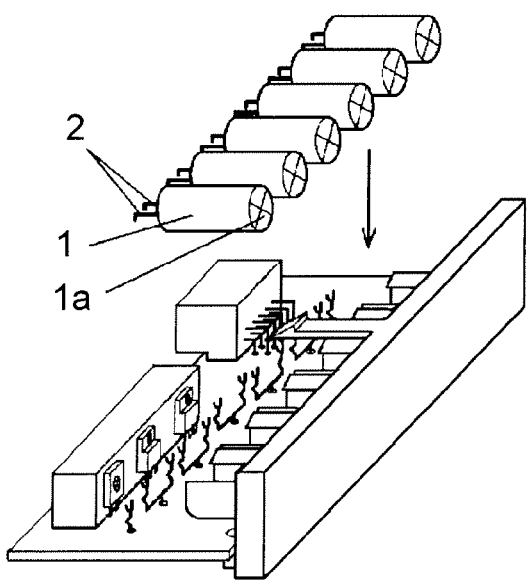
FIG. 5C is a partially exploded perspective view of a capacitor unit of another example according to the first embodiment of the present invention where the capacitor connection pin including the capacitor connecting portion at two locations is used.

A second example of the capacitor unit having a configuration partially different from the above will be described with reference to FIGS. 5A, 5B, and 5C. FIG. 5A is a partially exploded perspective view of a capacitor unit of another example according to the first embodiment of the present invention, and is a partially exploded perspective view in which the lengths of two lead wires 2 are different. FIG. 5B is a perspective view of capacitor connection pin 11 including capacitor connecting portion 11b at two locations in a capacitor unit of another example according to the first embodiment of the present invention. FIG. 5C is a partially exploded perspective view of a capacitor unit of another example according to the first embodiment of the present invention where capacitor connection pin 11 including capacitor connecting portion 11b at two locations is used.

FIG. 5A shows a configuration in which the lengths of two lead wires 2 are cut to a predetermined length so as to be different from each other according to polarity when capacitor 1 is arranged in a horizontal direction with respect to the length direction such that the polarities of two lead wires 2 are lined in the same direction without bending lead wire 2 in the perpendicular direction. The polarities can be distinguished from the difference in lengths, a step of bending in the perpendicular direction becomes unnecessary, and furthermore, lead wire hole 4 does not need to be formed in capacitor connection portion 11b since lead wire 2 is straight, and thus the productivity enhances.

However, in this case, the position of capacitor connection pin 11 is shifted according to polarity, and thus needs to be arranged according to the length of lead wire 2.

FIGS. 5B and 5C show a configuration in which capacitor connecting portion 11b at two locations is integrally formed in capacitor connection pin 11, where closest lead wires 2 of adjacent capacitors 1 are connected to capacitor connection portion 11b at two locations when capacitor 1 is held by holder 5. Closest lead wires 2, that is, lead wire 2 on the right side of certain capacitor 1 and lead wire 2 on the left side of adjacent capacitor 1 thus can be connected to one capacitor connection pin 11 as shown in FIG. 5B. Therefore, the quantity of capacitor connection pin 11 can be reduced as shown in FIG. 5C, whereby the productivity enhances by such amount. In this case, the quantity is reduced from twelve to seven.

Capacitor connection pin 11 shown in FIG. 5B has a structure same as FIGS. 1B and 1C other than that capacitor connecting portion 11b and bent portion 11g are arranged at two locations. The reason for arranging bent portion 11g is to prevent stress caused by external vibration etc. from transmitting to each other. The configurations of FIGS. 5B and 5C are limited to a case of connecting plurality of capacitors 1 in series.

Figure 6:
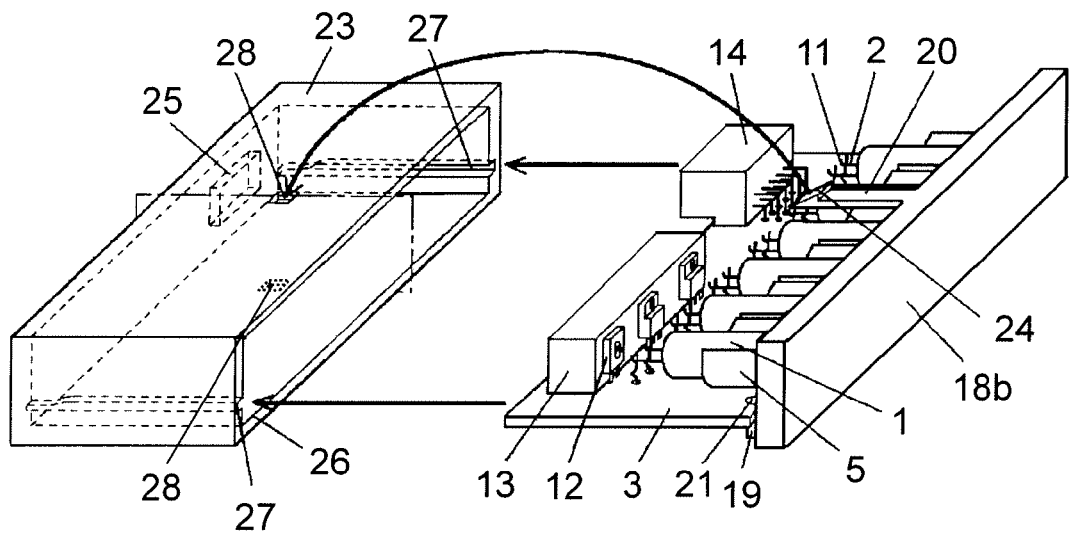
FIG. 6 is an exploded perspective view of the entire capacitor unit according to the first embodiment of the present invention.

Returning back to the configuration of FIG. 4, circuit substrate 3 and base part 18b of when mounting of capacitor 1 is terminated are shown on the right side of FIG. 6. FIG. 6 is an exploded perspective view of the entire capacitor unit according to the first embodiment of the present invention. Since capacitor 1 is mounted so as to overlap the upper space of circuit substrate 3, miniaturization is achieved. This is based on the following reasons.

If moisture proof agent 17b is formed after mounting capacitor 1, it becomes extremely difficult to form moisture proof agent 17b on circuit substrate 3 of the portion overlapping capacitor 1. Therefore, the upper space of circuit substrate 3 can be effectively utilized and miniaturization can be achieved by mounting capacitor 1 after forming moisture proof agent 17b on both surfaces of circuit substrate 3 in advance. Furthermore, according to the above configuration, capacitor 1 is arranged in the horizontal direction with respect to circuit substrate 3, and thus the height of the capacitor unit can be lowered.

Case 23 for encapsulating circuit substrate 3 will now be described with reference to FIG. 6. At this stage, all the circuit components including capacitor 1 are mounted on circuit substrate 3 and moisture proof agent 17b is formed, and thus case 23 will encapsulate all the circuit components mounted on circuit substrate 3 when case 23 encapsulates circuit substrate 3. Since capacitor 1 is mounted in the horizontal direction with respect to circuit substrate 3, miniaturization and lower height are achieved.

Case 23 is formed by injection molding resin similar to base part 18b so as to obtain the shape shown on the left side of FIG. 6. Connector hole 25 for partially projecting the distal end of connector 14 from case 23 is integrally formed in case 23 to connect connector 14 to an external wiring (not shown). Connector hole 25 is larger than the outer dimension of connector 14, and is formed on the surface (surface on the left side in FIG. 6) opposite to base part placement port 26 of case 23. Connector 14 and the external wiring thus can be connected, and connector 14 can be arranged in the same plane as circuit substrate 3 mounted with capacitor 1, whereby lower height is achieved.

Furthermore, groove 27 for placing circuit substrate 3 and positioning the same in case 23 is arranged in the wall face (left and right wall faces in FIG. 6) on both sides of base part placement port 26. The details of groove 27 will be hereinafter described.

Lock part 28 which fits with case fixing catch part 24 arranged at the distal end of elastic projection 20 is also integrally formed in case 23 to fix base part 18b. Lock part 28 is passed through, and the size thereof is slightly larger than case fixing catch part 24. Case fixing catch part 24 is thus reliably fitted to lock part 28, and case 23 and base part 18b are adequately fixed. Lock part 28 is arranged by the same number as elastic projection 20. Such number is two in the present embodiment, but may be appropriately increased by the size etc. of base part 18b and case 23.

Figure 7:
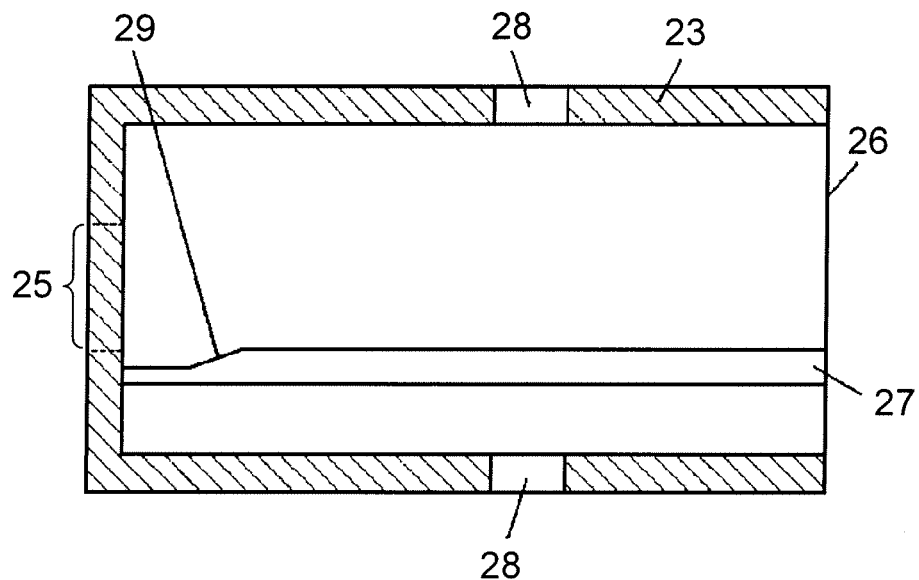
FIG. 7 is a cross sectional view of a case of the capacitor unit according to the first embodiment of the present invention.

The details of groove 27 will be described with reference to FIG. 7. FIG. 7 is a cross sectional view of case 23 in the chain dashed line shown in FIG. 6. The height of groove 27 is higher than the thickness of circuit substrate 3 on base part placement port 26 side and is given margin. Thus, circuit substrate 3 can be easily placed in groove 27, and the productivity enhances.

The distal end of groove 27 has a shape in which the width (corresponding to height herein) narrows. Specifically, one of either the upper or the lower side (upper side herein) of groove 27 has tapered portion 29 near the distal end. Thus, when placing circuit substrate 3 in groove 27, circuit substrate 3 is guided to the lower side of groove 27, that is, reference side for performing the positioning of circuit substrate 3 by tapered portion 29 formed near the distal end of groove 27, so that circuit substrate 3 can be easily fixed at the normal position.

According to such configuration, positioning of circuit substrate 3 is completed when circuit substrate 3 is placed to the far side of groove 27, and thus connector 14 accurately projects out from connector hole 25 without contacting case 23. Therefore, application of stress on the soldered portion of connector 14 due to the contact of connector 14 to case 23 in time of assembly can be prevented, and the reliability can be enhanced.

Furthermore, the possibility large components such as capacitor 1 other than connector 14 contact case 23 and apply stress to the soldered portion can be reduced by placing circuit substrate 3 along groove 27.

Therefore, circuit substrate 3 can be easily placed in case 23 so that large components do not contact case 23 having groove 27 formed to the shape shown in FIG. 7, and thus the productivity enhances, and furthermore, the reliability enhances.

The step of placing base part 18b in case 23 from circuit substrate 3 side will now be described.

Base part 18b fixed with circuit substrate 3 is placed by fitting both ends of circuit substrate 3 to groove 27 of case 23 as shown with a linear arrow of FIG. 6. Here, circuit substrate 3 can be easily placed since base part placement port 26 side of groove 27 is set to a height with margin with respect to the thickness of circuit substrate 3.

Furthermore, when base part 18b is placed to the far side of case 23, the height of groove 27 eventually becomes substantially equal to the thickness of circuit substrate 3 by tapered portion 29, and thus circuit substrate 3 is accurately positioned, and at the same time, the distal end of connector 14 projects out from connector hole 25.

When base part 18b is placed until the end of case 23, case fixing catch part 24 arranged at the distal end of elastic projection 20 fits in with lock part 28 arranged in case 23 as shown with a curved arrow in FIG. 6. Base part 18b and case 23 are thereby fixed.

In order to more reliably fix base part 18b and case 23, adhesive may be applied to the gap between base part 18b and case 23, case fixing catch part 24, groove 27, lock part 28, and the like. This not only allows secure fixation, but also achieves dust proof and moisture proof effect at the portion applied with adhesive.

The capacitor unit is formed as above. By eventually obtaining such configuration, effect of enhancement in reliability is obtained in addition to miniaturization and lower height, and enhancement in productivity.

According to the above structure, the capacitor unit having satisfactory productivity and having a compact and low height configuration is realized.

Figure 23:
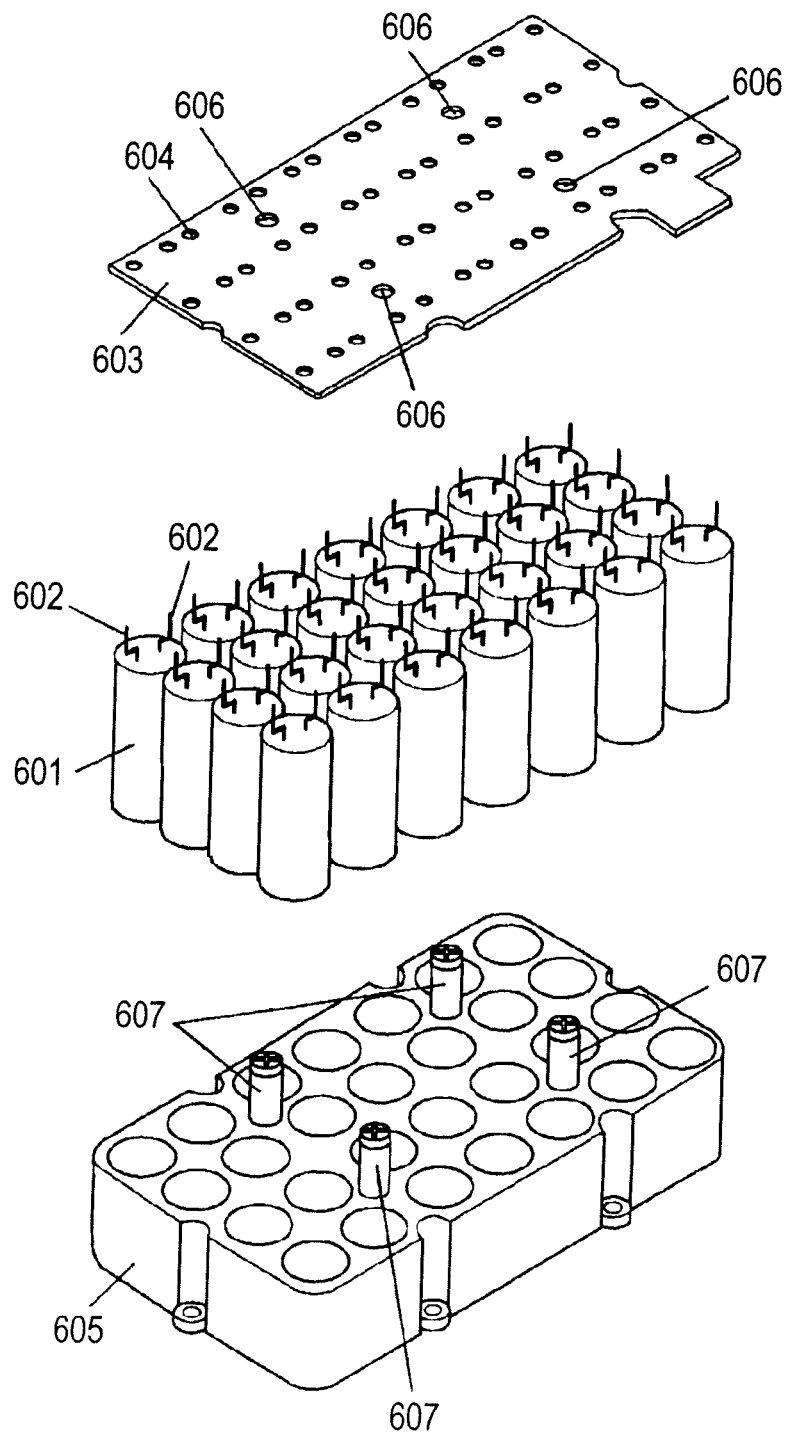
FIG. 23 is an exploded perspective view of a conventional capacitor unit.

Six capacitors 1 are used in the first embodiment, but twenty-eight capacitors 1 are used in the prior art (FIG. 23), and thus the quantity is different. This is due to difference in power specification of the capacitor unit, and the required quantity merely needs to be mounted according to the vehicle to mount the capacitor unit.

Second Embodiment

Figure 8:
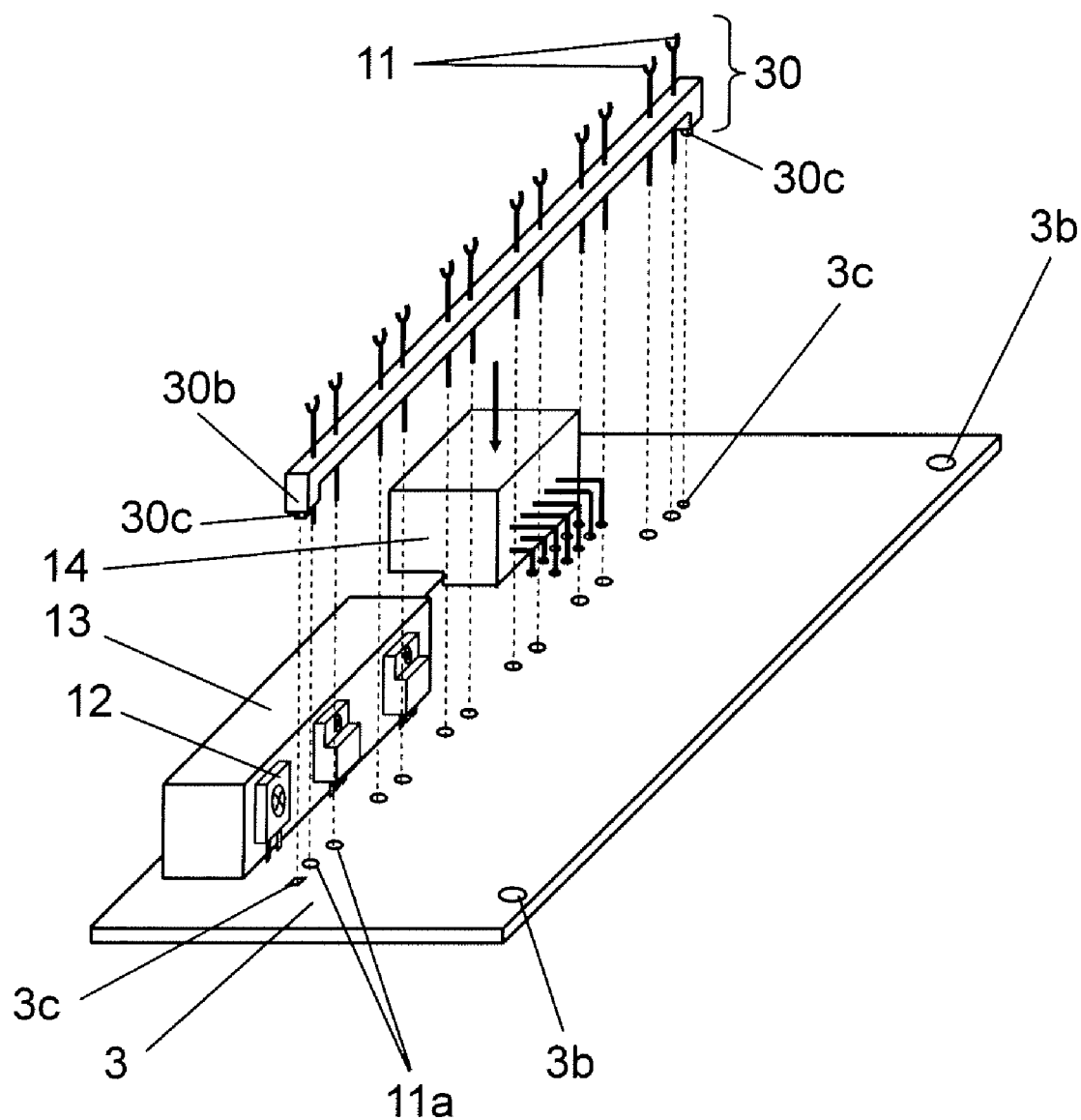
FIG. 8 is a partially exploded perspective view of a circuit substrate of a capacitor unit according to a second embodiment of the present invention.
Figure 9A:
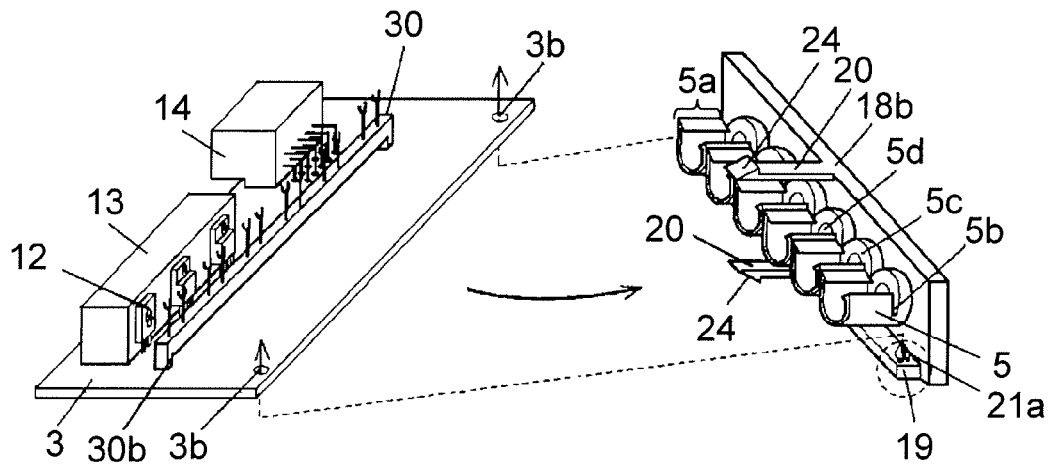
FIG. 9A is a perspective view showing a method of placing a circuit substrate to a base part of the capacitor unit according to the second embodiment of the present invention.
Figure 9B:
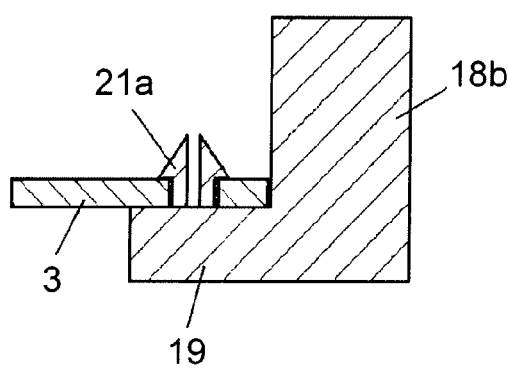
FIG. 9B is a cross sectional view of a fixing portion of when fixing the circuit substrate to the base part of the capacitor unit according to the second embodiment of the present invention.
Figure 9C:
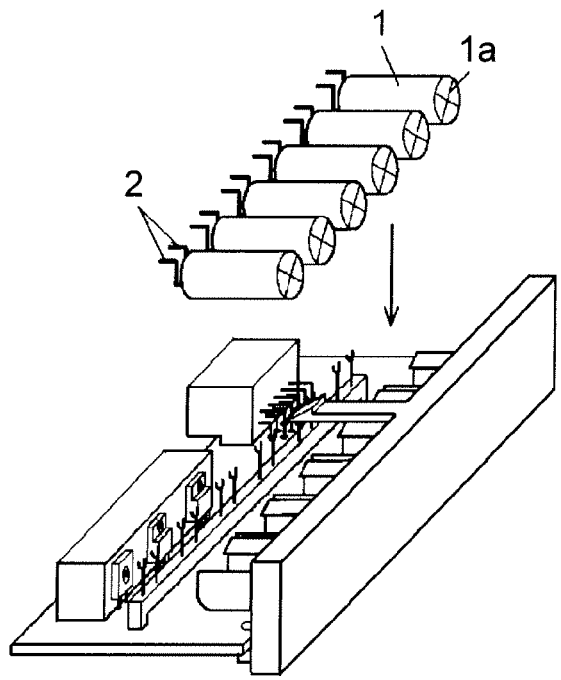
FIG. 9C is a perspective view showing a capacitor mounting method to the circuit substrate and the base part of the capacitor unit according to the second embodiment of the present invention.

FIG. 8 is a partially exploded perspective view of a circuit substrate of a capacitor unit according to a second embodiment of the present invention. FIG. 9A is a partially exploded perspective view of the capacitor unit according to the second embodiment of the present invention, and is a perspective view showing a method of placing a circuit substrate to base part 18b. FIG. 9B is a cross sectional view of a fixing portion of when fixing the circuit substrate to base part 18b of the capacitor unit according to the second embodiment of the present invention. FIG. 9C is a perspective view showing a capacitor mounting method to the circuit substrate and base part 18b of the capacitor unit according to the second embodiment of the present invention.

In the second embodiment, same reference numerals are used for the components same as the first embodiment, and detailed description thereof will be omitted. That is, the difference with the first embodiment will be described below.

1) Capacitor connection pin 11 has the lower end of intermediate portion 11f excluding circuit substrate placement portion 11c and capacitor connecting portion 11b shown in FIG. 1B molded with resin so that plurality of capacitor connection pins 11 are integrally molded as shown in FIG. 8, and a plurality of projections is arranged at the lower end of the molded resin.

2) As shown in FIG. 9A, snap 21a is integrally formed at circuit substrate fixing part 19, and circuit substrate fixing hole 3b is formed in circuit substrate 3, so that snap 21a fits into circuit substrate fixing hole 3b when fixing circuit substrate fixing part 19 to circuit substrate 3 to fix the same.

3) When capacitor 1 is arranged in the horizontal direction with respect to the length direction so that the polarities of two lead wires 2 are lined in the same direction as shown in FIG. 9C, two lead wires 2 are both bent so as to face the perpendicularly upward direction. At the same time, work, that is, crank shape working is performed on two lead wires 2 so as to be bent in the length direction of capacitor 1 at the portion of lower than or equal to the height of capacitor 1 and so as to move away from capacitor 1, and the distal end of lead wire 2 is cut to a predetermined length.

The following description will be made focusing on such differences.

First, with regards to integrated capacitor connection pin 30 of 1), twelve capacitor connection pins 11 are integrally formed by resin molding at the lower end of intermediate portion 11f, as shown in FIG. 8. According to such configuration, twelve capacitor connection pins 11 can be vertically mounted on circuit substrate 3 all at once and without requiring the trouble of lining the direction of each capacitor connecting portion 11b, whereby the productivity enhances compared to the first embodiment.

The portion to be resin molded is at the lower end of intermediate portion 11f as shown in FIG. 8, but this is because the molded resin will be supported only by capacitor connection pin 11 if arranged at the upper part of intermediate portion 11f and the stress caused by external vibration etc. propagates to all lead wires 2 via the molded resin. To reduce this, the molded resin is arranged at the lower part enabling stable support by contacting with circuit substrate 3.

Furthermore, plurality of integrated capacitor connection pin projections 30b are arranged at the lower end of resin molded at the lower end of intermediate portion 11f as shown in FIG. 8. In the second embodiment, integrated capacitor connection pin projection 30b is integrally formed only at both ends of integrated capacitor connection pin 30. Thus, the molded resin of integrated capacitor connection pin 30 is stably supported by integrated capacitor connection pin projection 30b when mounted to circuit substrate 3, and one part of intermediate portion 11f of each capacitor connection pin 11 is exposed by the height of integrated capacitor connection pin projection 30b.

When placing integrated capacitor connection pin 30 to circuit substrate 3 and soldering from the back surface of circuit substrate 3 in FIG. 8, it is reliably fixed as the solder goes around to the front side from capacitor connection pin hole 11a, whereby a space for the solder to go around needs to be provided and thus one part of intermediate portion 1 if is exposed.

By providing the space for the solder to go around, moisture proof agent 17b can spread over the soldered portion of the non-attachable components of moisture proof agent 17b through the space for the solder to go around when circuit substrate 3 is tilted as shown in FIG. 3C.

Therefore, moisture proof agent 17b can be formed similar to the first embodiment by arranging integrated capacitor connection pin projection 30b, whereby the productivity enhances, solder is not inhibited from going around to the front surface side of circuit substrate 3 of each capacitor connection pin 11, and the reliability enhances.

The number of integrated capacitor connection pin projection 30b is not limited to two as shown in the second embodiment and may be more. Convex part 30c different in at least size or shape from each other is arranged at the distal end of integrated capacitor connection pin projection 30b of at least two locations, and integrated capacitor connection pin attachment hole 3c of size or shape at least larger than convex part 30c may be formed at the position of circuit substrate 3 corresponding thereto. For instance, in FIG. 8, integrated capacitor connection pin attachment hole 3c and convex part 30c is a square and a circle, respectively. Thus, integrated capacitor connection pin 30 cannot be placed on circuit substrate 3 unless the size and/or shape of convex part 30c and integrated capacitor connection pin attachment hole 3c match, whereby mistaking the placing direction does not occur and the productivity and the yield enhance.

With regards to the method of fixing circuit substrate 3 of 2), snap 21a integrally formed with base part 18b as shown in FIGS. 9A and 9B is used. As shown in the cross sectional view of FIG. 9B, snap 21a has an umbrella shape with a slit at the central part, and circuit substrate fixing hole 3b shown in FIG. 9A is formed at the position corresponding to snap 21a. The lower part of snap 21a (correspond to shaft part of umbrella shape) has a diameter slightly smaller than the diameter of circuit substrate fixing hole 3b, and a height slightly higher than the thickness t of circuit substrate 3. Therefore, when placing circuit substrate fixing hole 3b from the upper side of snap 21a, circuit substrate 3 is placed while closing the slit, and the slit is widened when circuit substrate 3 contacts circuit substrate fixing part 19, whereby circuit substrate fixing hole 3b is fitted at the umbrella portion of snap 21a. Circuit substrate 3 is thereby fixed at circuit substrate fixing part 19.

According to such fixing method, screw 21 and screw tightening step as in the first embodiment are unnecessary, and the productivity can be significantly enhanced.

The number of snaps 21a is not limited to two shown in the second embodiment, and may be more.

With regards to the bending work of two lead wires 2 of capacitor 1 of 3), crank shape as shown in FIG. 9C is realized. Thus, the polarities of lead wire 2 can be distinguished, whereby the direction in fitting capacitor 1 to holder 5 will not be mistaken, and the productivity enhances. Furthermore, since crank shape is obtained, external stress of impact etc. of the vehicle can be absorbed at the relevant portion. Therefore, bent portion 11g does not need to be formed at capacitor connection pin 11, and reliability similar to the first embodiment is obtained.

The distal end of lead wire 2 is lower than or equal to the height of capacitor 1, but is at a position higher than the projecting portion of lead wire 2 of capacitor 1 as it is bent as in FIG. 9C. Therefore, capacitor connecting portion 11b can be arranged higher than in the first embodiment, whereby the soldering task is further facilitated, and the productivity further enhances from this aspect.

However, since the length of lead wire 2 becomes long, the internal resistance reducing effect of entire capacitor 1 by lead wire 2 as in the first embodiment is small even if capacitor connection pin 11 made of copper is used. Therefore, the optimum configuration can be selected according to the usage environment and condition (performance, productivity, cost, and the like).

The assembling method of the second embodiment will now be described centering on the difference with the first embodiment.

First, as shown in FIG. 8, integrated capacitor connection pin 30 is placed in capacitor connection pin hole 11a and mounted on circuit substrate 3 mounted with circuit components, and soldered from the back surface of circuit substrate 3 to be fixed. Integrated capacitor connection pin 30 may be mounted any time as long as problems do not arise in mounting other circuit components.

Moisture proof agent 17b is then formed on both surfaces of circuit substrate 3. The manufacturing method thereof is exactly the same as in FIGS. 2, 3A, 3B, and 3C.

Circuit substrate 3 mounted with integrated capacitor connection pin 30 and completed with formation of moisture proof agent 17b is shown on the left side in FIG. 9A. Circuit substrate 3 is then fixed to base part 18b as shown with the arrow. The fixing method in this case is as described in 2) above.

Capacitor 1 is then fitted in holder 5. The structure of holder 5 is the same as the first embodiment. Therefore, capacitor 1 is arranged in the horizontal direction at the upper space of circuit substrate 3, and miniaturization and lower height can be realized.

When fitting capacitor 1 in holder 5, the soldering task can be easily performed after capacitor 1 is fitted since lead wire 2 is bending worked to the crank shape, and the distal end thereof exactly reaches capacitor connection portion 11b. As a result, capacitor 1 is electrically connected so as to be perpendicular to the length direction of capacitor connection pin 11.

In the second embodiment, the most distal end of lead wire 2 is not performed with the work of bending in the perpendicular direction as in the first embodiment. This is due to the following reasons.

In the first embodiment, a configuration of lowering the internal resistance by shortening the length of lead wire 2 as much as possible is originally adopted, but the distal end is slightly performed with bending work as the polarities cannot be distinguished if lead wire 2 is simply cut short. Thus, if the bent distal end contacts capacitor connecting portion 11b, lead wire 2 floats from capacitor connecting portion 11b by the bent amount and thus the soldering workability degrades. Thus, lead wire hole 4 is formed at the bottom part of capacitor connecting portion 11b, and the distal end of bent lead wire 2 is placed therein to suppress lead wire 2 from floating. As a result, positioning of lead wire 2 becomes accurate, soldering property improves, and the productivity enhances.

In the second embodiment, the polarities can be distinguished as lead wire 2 is bent to the crank shape. Therefore, lead wire hole 4 does not need to be formed at the bottom part of capacitor connecting portion 11b, and the distal end of lead wire 2 does not need to be placed. Thus, lead wire hole 4 is not formed at the bottom part of capacitor connecting portion 11b of the second embodiment. Due to the above reasons, the most distal end of lead wire 2 is not performed with the work of bending in the perpendicular direction as in the first embodiment. However, the soldering workability enhances as described in the first embodiment with respect to the shape (U-shape or V-shape) of the capacitor connecting portion 11b, and thus the shape same as in the first embodiment is obtained.

Figure 10:
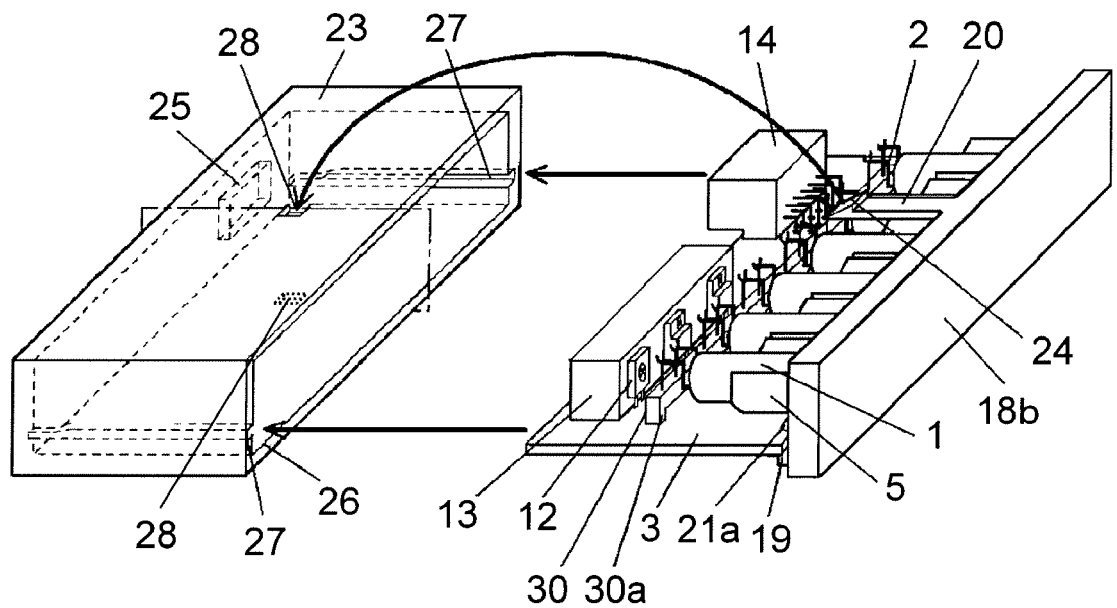
FIG. 10 is an exploded perspective view of the entire capacitor unit according to the second embodiment of the present invention.

FIG. 10 is an exploded perspective view of the entire capacitor unit according to the second embodiment of the present invention. As shown with the arrow of FIG. 10, after the soldering of each capacitor 1 is completed, circuit substrate 3 is placed in case 23, and the capacitor unit is completed. The structure of case 23, the method of fixing with base part 18b, and the like are exactly the same as the first embodiment.

According to the above structure, the capacitor unit having satisfactory productivity and having a compact and low height configuration is realized.

The use of integrated capacitor connection pin 30 and the bending work to crank shape of lead wire 2 described in the second embodiment may be similarly carried out in the first embodiment.

However, when using integrated capacitor connection pin 30 in the first embodiment, bent portion 11g needs to be formed. In this case, the molded resin needs to be formed at the lower end of intermediate portion 11f other than at bent portion 11g. The stress applied on lead wire 2 and capacitor connection pin 11 thus can be absorbed at bent portion 11g, whereby high reliability similar to the first embodiment is obtained.

If formed at the upper end of bent portion 11g, stress caused by external vibration etc. propagates to all lead wires 2, where a configuration without the portion for absorbing the propagated stress is obtained as the length of lead wire 2 is cut to be the shortest. Therefore, from the standpoint of reliability, the molded resin needs to be formed at the lower end of intermediate portion 11f other than bent portion 11g.

Third Embodiment

Figure 11A:
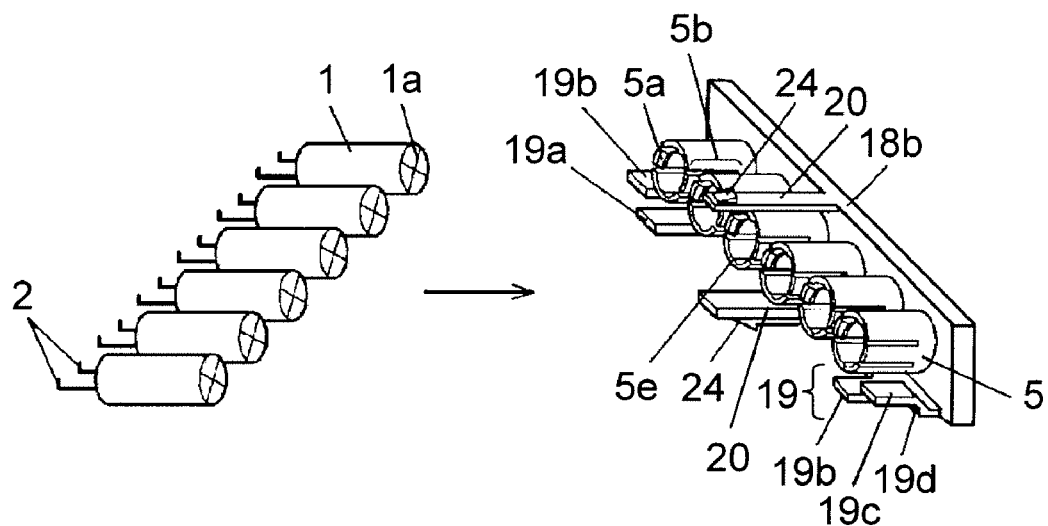
FIG. 11A is a perspective view showing a capacitor holding method to a base part of a capacitor unit according to the third embodiment of the present invention.
Figure 11B:
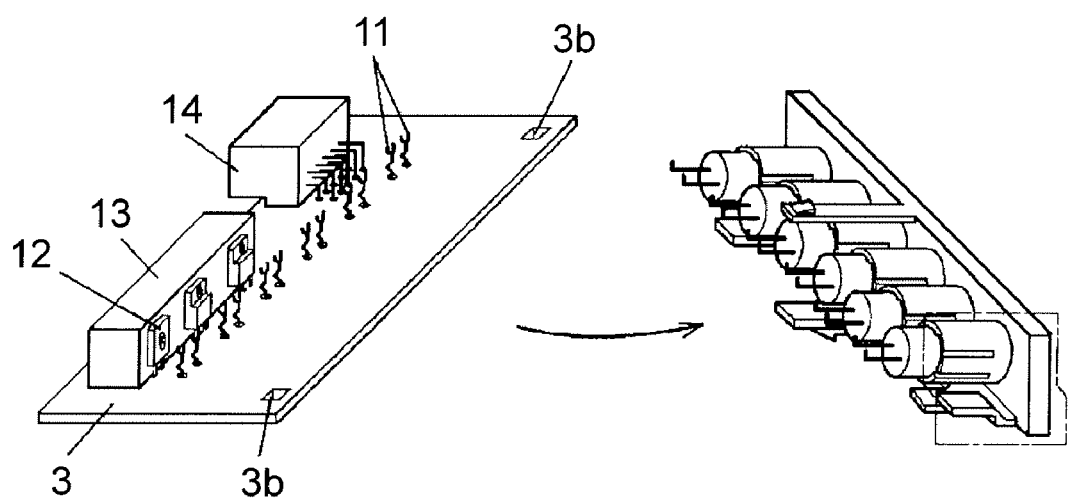
FIG. 11B is a perspective view showing a method of placing the circuit substrate to the base part of the capacitor unit according to the third embodiment of the present invention.

FIG. 11A is a partially exploded perspective view of base part 18b, the capacitor, and the circuit substrate of a capacitor unit according to a third embodiment of the present invention, and is a perspective view showing a capacitor holding method to base part 18b. FIG. 11B is a perspective view showing a method of placing the circuit substrate to base part 18b of the capacitor unit according to the third embodiment of the present invention. In the third embodiment, same reference numerals are used for the components same as the first embodiment and the second embodiment, and the detailed description thereof will be omitted. That is, the difference with the first embodiment and the second embodiment will be described below.

1) Holder 5 has a cylindrical shape with elastic portion 5a and cutout portion 5b, where circuit substrate 3 is placed on base part 18b after placing capacitor 1 in holder 5 in advance.

2) Circuit substrate fixing part 19 includes circuit substrate fixing projection 19b arranged in a direction perpendicular to base part 18b, and circuit substrate fixing catch portion 19c with elasticity arranged at a position of a spacing substantially equal to thickness t of circuit substrate 3 in the height direction from circuit substrate fixing projection 19b. Circuit substrate fixing hole 3b is formed in circuit substrate 3, so that circuit substrate 3 and circuit substrate fixing part 19 are fixed by placing circuit substrate 3 between circuit substrate fixing projection 19b and circuit substrate fixing catch portion 19c, and fitting circuit substrate fixing catch portion 19c to circuit substrate fixing hole 3b when fixing circuit substrate 3 to circuit substrate fixing part 19.

3) After placing circuit substrate 3 in case 23, one side of circuit substrate 3 most distant from base part 18b contacts circuit substrate contacting portion 23a in case 23.

The following description will be made focusing on such differences.

First, the difference in the assembly step of 1) will be described with reference to FIGS. 11A and 11B. As shown on the right side in FIG. 11A, holder 5 of base part 18b has a cylindrical shape, where cutout portion 5b is formed at four locations up to the middle. The cylinder is thus divided into four portions, where elastic portion 5a is formed at two arbitrary opposing locations by thickening the distal end of cutout portion 5b, and rib 5e is formed in the length direction of the cylinder on at least one location of the remaining two locations.

The inner diameter of the cylindrical shape is formed to be slightly larger than the outer diameter of capacitor 1, and thus capacitor 1 is placed in holder 5 so that the direction of lead wire 2 is lined using a jig etc. (not shown) from the direction of the arrow of FIG. 11A. Capacitor 1 is thus guided in a direction parallel to the cylindrical shape while widening elastic portion 5a and contacting rib 5e. Therefore, capacitor 1 is securely fixed by the elasticity of elastic portion 5a while being positioned by rib 5e. According to such configuration, the tolerance of capacitor 1 and holder 5 can be absorbed similar to the first embodiment, and capacitor 1 can be reliably fixed. Cutout portion 5b is not particularly limited to four locations.

In the third embodiment as well, the distal end of lead wire 2 is performed with bending work so as to be directed in the perpendicular direction similar to the first embodiment so that the polarity of capacitor 1 is not mistaken when placing capacitor 1 in holder 5. However, as capacitor 1 is placed in holder 5 first in the third embodiment, lead wire 2 is bending worked in the direction opposite to the first embodiment so that capacitor connecting portion 11b and lead wire 2 shown in FIG. 1B do not contact when placing circuit substrate 3 to base part 18b the next time. As a result, the polarity can be distinguished, and furthermore, assembly is facilitated since lead wire 2 is smoothly placed in capacitor connecting portion 11b when circuit substrate 3 is placed on base part 18b, and the productivity is enhanced. Similar to the second embodiment, lead wire hole 4 does not need to be formed in capacitor connection pin 11.

Figure 12A:
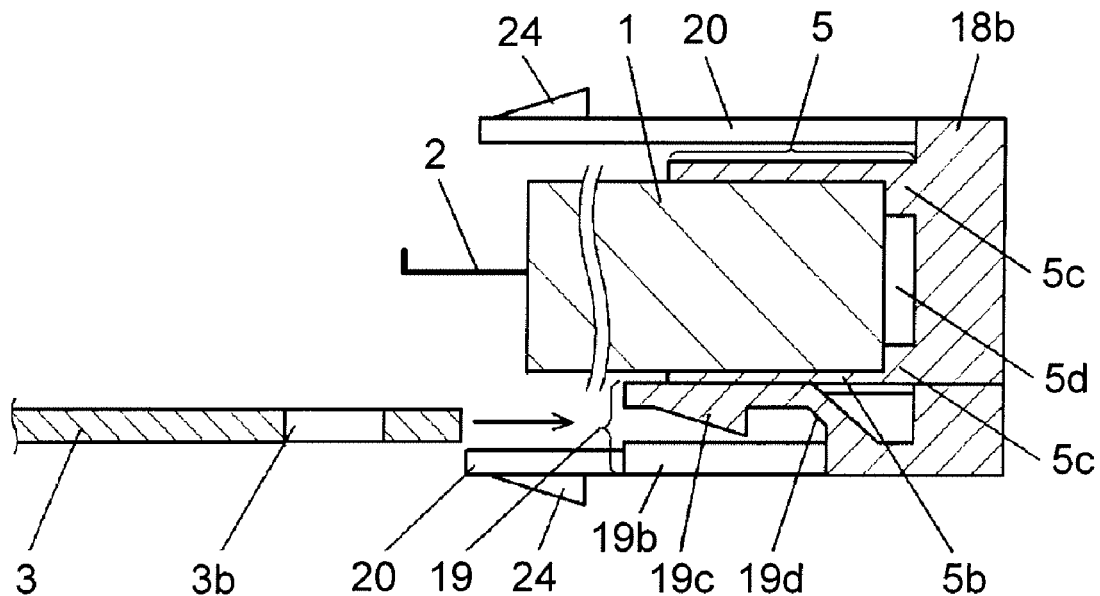
FIG. 12A is a cross sectional view of the base part after holding the capacitor of the capacitor unit according to the third embodiment of the present invention, and is a cross sectional view before placing the circuit substrate on the base part.

Similar to the second embodiment, in holder 5, space 5d of concave shape is arranged at the portion of seat 5c as shown in FIG. 12A or the cross sectional view of chain dashed line portion of FIG. 11B. Capacitor 1 is placed until contacting seat 5c, and space 5d is formed to a size explosion proof valve 1a of capacitor 1 can sufficiently operate, and thus the electrolytic solution will not fly in all directions even if explosion proof valve 1a operates, and high reliability is obtained.

Figure 12B:
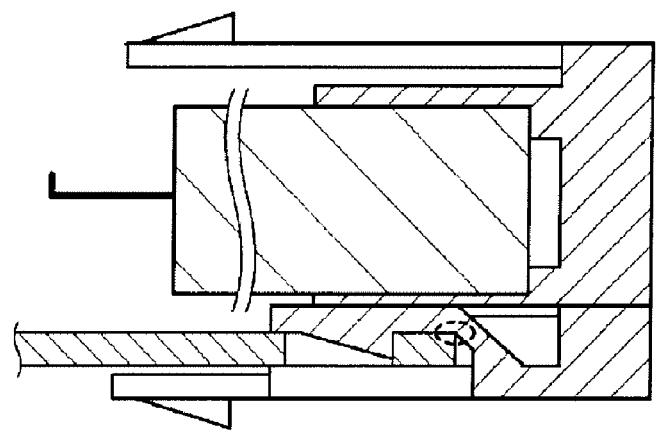
FIG. 12B is a cross sectional view of the base part after holding the capacitor of the capacitor unit according to the third embodiment of the present invention, and is a cross sectional view after placing the circuit substrate on the base part.

Circuit substrate fixing part 19 of 2) will now be described. In the third embodiment, circuit substrate fixing part 19 includes circuit substrate fixing projection 19b and circuit substrate fixing catch portion 19c, and is integrally formed in the vertical direction with base part 18b. The details of such part will be described with reference to FIGS. 12A and 12B. FIG. 12A is a cross sectional view of base part 18b after holding capacitor 1 of the capacitor unit according to the third embodiment of the present invention, and is a cross sectional view before placing circuit substrate 3 on base part 18*b*. FIG. 12B is a cross sectional view of base part 18*b* after holding capacitor 1 of the capacitor unit according to the third embodiment of the present invention, and is a cross sectional view after placing circuit substrate 3 on base part 18*b*.

Circuit substrate fixing projection 19*b* and circuit substrate fixing catch portion 19*c* are arranged with a spacing substantially equal to thickness t of circuit substrate 3. Circuit substrate fixing catch portion 19*c* has a structure in which one part is tapered, and such tapered shape is formed at the position to be fit with circuit substrate fixing hole 3*b* formed in circuit substrate 3 as shown in FIG. 12B. Furthermore, inclined portion 19*d* that contacts the end (right end of circuit substrate 3 shown with an elliptical dotted line in FIG. 12B) of circuit substrate 3 is arranged at the basal portion of circuit substrate fixing catch portion 19*c*.

Circuit substrate fixing catch portion 19*c* is arranged to be fit in the vicinity of the end of circuit substrate 3 at the upper side of circuit substrate 3. Circuit substrate fixing catch portion 19*c* is arranged at the end (front right end and back right end in FIG. 11B) of circuit substrate 3 as much as possible so as not to interfere with holder 5, whereby the spacing between circuit substrate fixing catch portion 19*c* and holder 5 can be narrowed by the relevant amount as shown in FIGS. 12A and 12B, and miniaturization and lower height can be achieved.

Circuit substrate fixing projection 19*b* is larger than circuit substrate fixing catch portion 19*c*. Circuit substrate fixing projection 19*b* serves to position circuit substrate 3, where if such portion is weak, the position of circuit substrate 3 may shift and affect the productivity. The thickness is increased in the third embodiment to have circuit substrate fixing projection 19*b* larger than circuit substrate fixing catch portion 19*c*, but the width may be widened, the length may be increased, or the above aspects may be combined.

When circuit substrate 3 is placed on circuit substrate fixing part 19, circuit substrate fixing projection 19*b* is arranged at a position not overlapping circuit substrate fixing hole 3*b*. That is, as shown in FIGS. 11A and 11B, circuit substrate fixing projection 19*b* and circuit substrate fixing catch portion 19*c* are arranged at positions shifted from each other. Thus, when circuit substrate 3 is placed on circuit substrate fixing part 19, whether or not circuit substrate fixing catch portion 19*c* is normally fitted in circuit substrate fixing hole 3*b* can be easily checked visually, and the productivity and yield enhance.

Figure 13A:
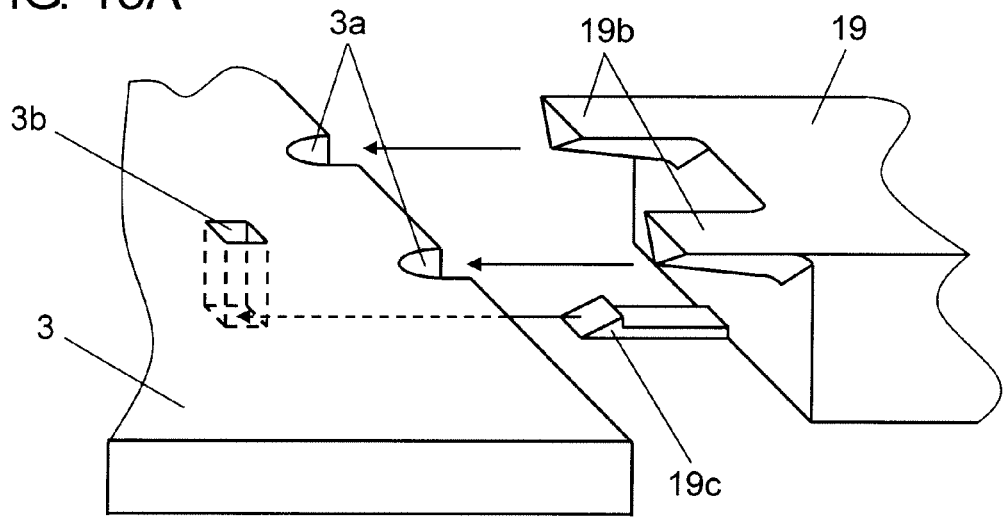
FIG. 13A is an enlarged perspective view of a circuit substrate fixing part when the cross section of the circuit substrate fixing projection is a triangle in the capacitor unit according to the third embodiment of the present invention.

Circuit substrate fixing part 19 may be configured as shown in FIG. 13A. FIG. 13A is an enlarged perspective view of circuit substrate fixing part 19 when the cross section of circuit substrate fixing projection 19*b* is a triangle in the capacitor unit according to the third embodiment of the present invention. That is, two circuit substrate fixing projections 19*b* are integrally formed in the vertical direction with base part 18 at both lower ends of base part 18*b*. The cross section of circuit substrate fixing projection 19*b* is a triangle, and a tapered shape is formed at the lower side of the triangle so as to be thicker towards the base. Accordingly, as shown with a solid line arrow in FIG. 13A, positioning concave part 3*a* arranged in circuit substrate 3 is in corresponding position relationship with circuit substrate fixing projection 19*b*, and thus circuit substrate 3 is easily and accurately placed between circuit substrate fixing projection 19*b* and circuit substrate fixing catch portion 19*c*.

Circuit substrate fixing catch portion 19*c* is integrally formed in the vertical direction at both lower ends of base part 18*b* similar to circuit substrate fixing projection 19*b*. Furthermore, circuit substrate fixing catch portion 19*c* is formed at a position of a spacing substantially equal to the thickness of circuit substrate 3 in the height direction (downward direction in FIG. 13A) from circuit substrate fixing projection 19*b*, and also has elasticity. Therefore, when circuit substrate 3 is placed between circuit substrate fixing projection 19*b* and circuit substrate fixing catch portion 19*c*, circuit substrate fixing catch portion 19*c* fits with circuit substrate fixing hole 3*b* formed in circuit substrate 3 at a position corresponding to circuit substrate fixing catch portion 19*c*. This is because circuit substrate fixing hole 3*b* is formed to a shape slightly larger than circuit substrate fixing catch portion 19*c*. Since the length of positioning concave part 3*a* is shorter than the length of circuit substrate fixing projection 19*b*, the distal end of circuit substrate fixing projection 19*b* is pushed in farther than positioning concave part 3*a* up to the position circuit substrate fixing catch portion 19*c* fits into circuit substrate fixing hole 3*b*. Circuit substrate 3 is securely fixed by both surfaces of circuit substrate fixing projection 19*b* and circuit substrate fixing catch portion 19*c* by the repulsive force towards the front surface of circuit substrate 3 by circuit substrate fixing projection 19*b* in addition to the fitting of circuit substrate fixing catch portion 19*c* to circuit substrate fixing hole 3*b*.

Therefore, circuit substrate 3 is placed with the positions of positioning concave part 3*a* and circuit substrate fixing projection 19*b* matched, whereby compared to the configuration of FIG. 11B, circuit substrate 3 can be placed more easily and accurately, the productivity is enhanced, circuit substrate 3 is securely fixed, and high reliability is obtained with respect to external stress of vehicle vibration etc.

Since circuit substrate fixing projection 19*b* has a narrow width, the stress tends to concentrate at the base when circuit substrate 3 is placed. A curvature part is thus formed at the base portion for reinforcement in FIG. 13A. In addition to such method, the number of circuit substrate fixing projection 19*b* may be greater than circuit substrate fixing catch portion 19*c*, circuit substrate fixing projection 19*b* may be larger than circuit substrate fixing catch portion 19*c*, or the above aspects may be simultaneously implemented.

Furthermore, circuit substrate fixing projection 19*b* is arranged at a position not overlapping circuit substrate fixing hole 3*b* when circuit substrate 3 is placed on circuit substrate fixing part 19. The fitting of circuit substrate fixing catch portion 19*c* to circuit substrate fixing hole 3*b* thus can be visually checked similar to the configuration of FIG. 11B, and the productivity enhances.

Figure 13B:
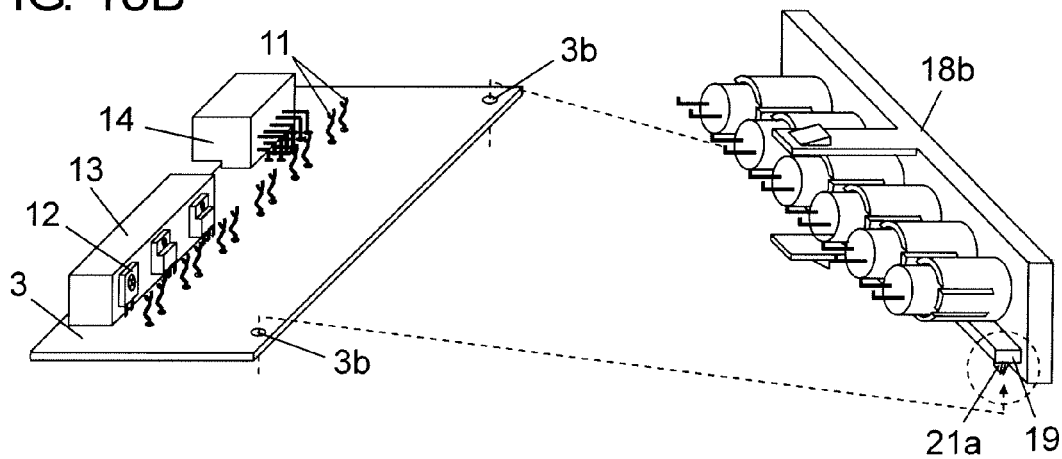
FIG. 13B is a perspective view showing a circuit substrate placement method to a snap arranged at the base part of the capacitor unit according to the third embodiment of the present invention.
Figure 13C:
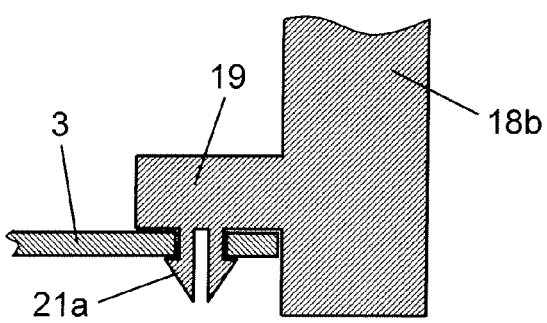
FIG. 13C is a cross sectional view of the fixing portion when fixing the circuit substrate to the snap arranged on the base part of the capacitor unit according to the third embodiment of the present invention.

Circuit substrate fixing part 19 may have a configuration shown in FIG. 13B and FIG. 13C. FIG. 13B is a perspective view showing a circuit substrate placement method to snap 21*a* arranged at base part 18*b* of the capacitor unit according to the third embodiment of the present invention. FIG. 13C is a cross sectional view of the fixing portion when fixing circuit substrate 3 to snap 21*a* arranged on base part 18*b* of the capacitor unit according to the third embodiment of the present invention. That is, circuit substrate fixing part 19 is configured by snap 21*a* shown in FIG. 9A. However, as shown in FIG. 11A, capacitor 1 is placed in holder 5 beforehand in the third embodiment, and thus lead wire 2 and capacitor connection pin 11 interfere when attaching circuit substrate 3 to circuit substrate fixing part 19 in the direction of snap 21*a* as shown in FIG. 9A. Thus, snap 21*a* is arranged on the lower side of circuit substrate fixing part 19 as shown in FIG. 13B. As shown in the cross sectional view of the portion circled with a dotted line of FIG. 13B, that is, shown in FIG. 13C, snap 21*a* is placed in circuit substrate fixing hole 3*b* in the upward direction from the lower side of base part 18*b* to fix circuit substrate 3. Therefore, lead wire 2 and capacitor connection pin 11 do not interfere. According to such fixing method as well, whether or not circuit substrate 3 is normally fixed by snap 21a can be easily checked visually, and thus productivity and yield enhance.

The method of placing and mounting capacitor 1 and circuit substrate 3 to base part 18b will be described centering on the features 1) and 2) described above.

First, capacitor 1 is placed in holder 5 of base part 18b from the direction of arrow as shown in FIG. 11A. Capacitor 1 is placed sequentially or all at once with the directions of lead wire 2 lined as in FIG. 11A by a jig and the like. Capacitor 1 is placed until contacting seat 5c shown in FIGS. 12A and 12B.

Circuit substrate 3 formed in advance with moisture proof agent 17b is then placed on base part 18b with the manufacturing method shown in FIGS. 2, 3A, 3B, and 3C. Circuit substrate 3 is placed between circuit substrate fixing projection 19b and circuit substrate fixing catch portion 19c as shown with the arrow in FIG. 12A. As a result, circuit substrate fixing catch portion 19c fits into circuit substrate fixing hole 3b due to its elasticity, as shown in FIG. 12B. Base part 18b and circuit substrate 3 are thereby fixed. In the case of FIGS. 13B and 13C, base part 18b and circuit substrate 3 are fixed by placing snap 21a in circuit substrate fixing hole 3b.

Subsequently, lead wire 2 and capacitor connecting portion 11b are soldered, and mounting of capacitor 1 is completed as shown on the right view in FIG. 6 of the first embodiment.

As apparent from the above description, circuit substrate 3 does not need to be fixed to base part 18b with screw 21 in the third embodiment, similar to the second embodiment, and thus screw 21 itself is unnecessary and the screw tightening step is unnecessary, whereby the productivity further enhances compared to the first embodiment.

Figure 14A:
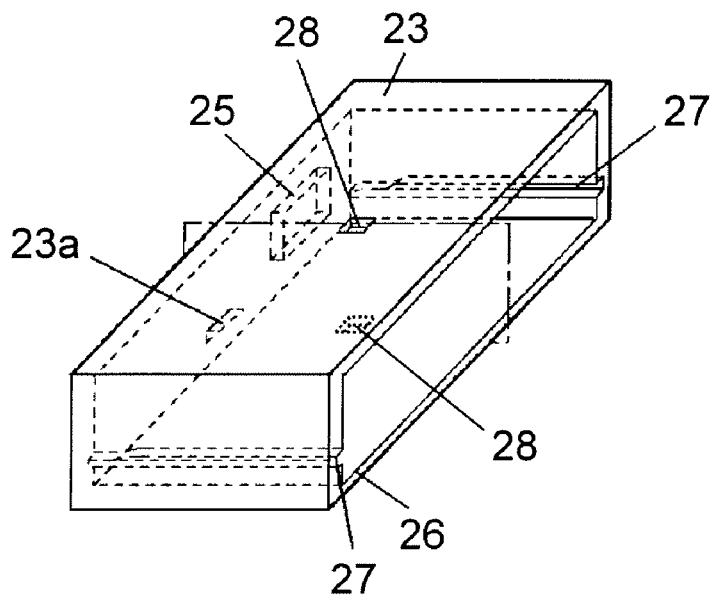
FIG. 14A is a perspective view showing a structure of a case of the capacitor unit according to the third embodiment of the present invention.
Figure 14B:
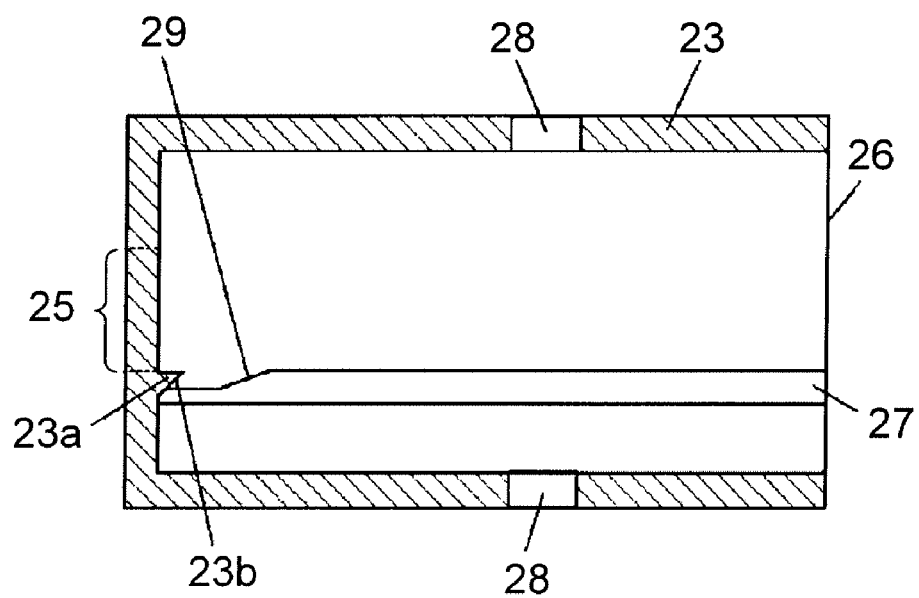
FIG. 14B is a cross sectional view showing the structure of the case of the capacitor unit according to the third embodiment of the present invention.

The feature 3) of the third embodiment will be described with reference to FIGS. 14A and 14B. FIG. 14A is a perspective view showing a structure of case 23 of the capacitor unit according to the third embodiment of the present invention. FIG. 14B is a cross sectional view showing the structure of case 23 in a chain dashed line shown in FIG. 14A. The structure of case 23 is basically the same as in the first embodiment and the second embodiment, but differs in that circuit substrate contacting portion 23a is integrally formed as shown in FIGS. 14A and 14B. When circuit substrate 3 is placed in case 23, one side of circuit substrate 3 most distant from base part 18b, that is, the left side of circuit substrate 3 in FIG. 11B contacts thereto.

The detailed shape of circuit substrate contacting portion 23a has a configuration including case inclined portion 23b so that stress is applied in the vertical direction (downward direction in FIG. 14B) on the side (left side) of circuit substrate 3 contacting circuit substrate contacting portion 23a, as shown in the cross sectional view of case 23 of FIG. 14B. Circuit substrate 3 is securely fixed by such stress.

Therefore, in placing base part 18b to case 23, which is the final step in assembly, as circuit substrate 3 is placed along groove 27, the left side of circuit substrate 3 is eventually accurately positioned at the lower side of groove 27 by tapered portion 29. Thereafter, case fixing catch part 24 eventually fits into lock part 28 thereby fixing base part 18b and case 23. In this case, the left side of circuit substrate 3 contacts case inclined portion 23b of circuit substrate contacting portion 23a, and at the same time, the right side of circuit substrate 3 (mounting side of capacitor 1) contacts inclined portion 19d arranged at the base of circuit substrate fixing catch portion 19c, as shown with a dotted line portion of FIG. 12B. As a result, circuit substrate 3 contacts inclined portion 19d at both ends on the right side and case inclined portion 23b at the middle on the left side, whereby stress in the downward direction is applied to circuit substrate 3. However, circuit substrate 3 is securely fixed inside case 23 since the stress by inclined portion 19d is received by circuit substrate fixing projection 19b, and the stress by case inclined portion 23b is received by the lower side of groove 27. Accordingly, circuit substrate 3 can be very easily and securely fixed, productivity can be enhanced, and at the same time, does not resonate even with respect to vehicle vibration etc. on circuit substrate 3 and high reliability can be obtained.

In the third embodiment, the width of elastic projection 20 is made larger than the width of case fixing catch part 24. Thus, when base part 18b is placed and fixed in case 23, the gap between case fixing catch part 24 and lock part 28 is blocked by elastic projection 20, thereby preventing foreign substances such as dust from entering inside case 23 from the gap. This configuration may be implemented in the first embodiment or the second embodiment.

The configurations and manufacturing methods other than those described above are the same as the first embodiment and the second embodiment, and thus detailed description thereof will be omitted.

According to the above structure, the capacitor unit having satisfactory productivity and having a compact and low height configuration is realized.

As a method of increasing the quantity of capacitor 1 or reducing the bottom area of the capacitor unit in the third embodiment, a configuration of lining capacitors 1 to overlap in two or more columns may be adopted instead of lining in one column. In this case as well, capacitor 1 can be placed and connected after mounting capacitor connection pin 11 on circuit substrate 3 in advance and forming moisture proof agent 17b, and thus the capacitor unit satisfying satisfactory productivity and compact configuration can be realized.

In the first to the third embodiments, capacitor 1 is described as being a cylindrical shape, but is not limited thereto, and may be a square column shape or the like.

Fourth Embodiment

Figure 15:
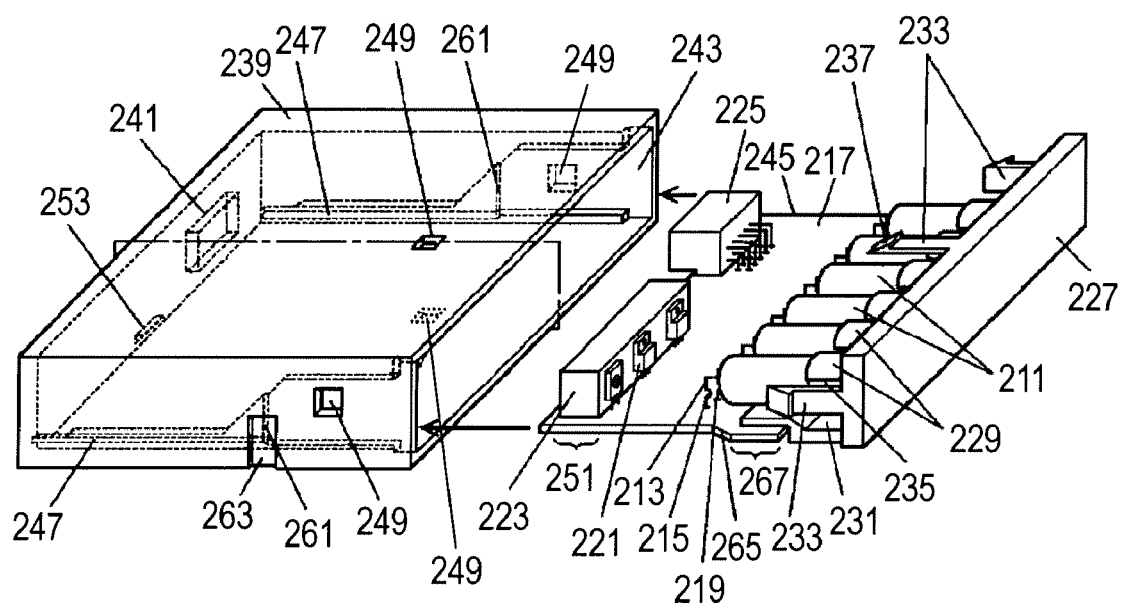
FIG. 15 is a partially exploded perspective view of a capacitor unit according to a fourth embodiment of the present invention.

FIG. 15 is a partially exploded perspective view of a capacitor unit according to a fourth embodiment of the present invention. As shown in FIG. 15, plurality of capacitors 211 includes an electrical double layer capacitor of cylindrical shape. In the fourth embodiment, an example where the number of capacitors 211 is six is shown. Two lead wires 213 are arranged on one end face (left side surface in FIG. 15) of each capacitor 211. Two lead wires 213 are performed with bending work in advance so that the respective polarities are in the same direction. That is, the distal end of lead wire 213 is performed with bending work so as to be perpendicular to the length direction of capacitor 211 with lead wire 213 on capacitor 211 of FIG. 15 lined such that lead wire 213 on the near side (left side when seen from above capacitor 211) is positive pole and lead wire 213 on the far side (right side when seen from above capacitor 211) is negative pole. Thereafter, the distal ends of two lead wires 213 are cut in advance to a predetermined length. The predetermined length is the length without excess or deficiency when capacitor 211 is mounted.

Bent portion 215 is arranged at one part of each lead wire 213 in the perpendicular direction (vertical direction in FIG. 15) with respect to the length direction of capacitor 211. Bent portion 215 is formed by performing bending work on lead wire 213 to a semicircular shape as in FIG. 15. The external stress of vehicle vibration etc. applied to lead wire 213 can be absorbed, and high reliability is obtained. The shape of bent portion 215 is not limited to a semicircle, and may be a "dogleg" shape and the like.

Capacitor 211 which lead wire 213 is worked is placed in lead wire hole 219 formed in circuit substrate 217. According to such configuration, capacitor 211 is arranged in the horizontal direction with respect to circuit substrate 217, and thus miniaturization and lower height of the capacitor unit are achieved. In the fourth embodiment, the circuit components for electrically controlling capacitor 211 such as the charging/discharging circuit, the state detection circuit, and the like are mounted on circuit substrate 217 in advance. Among them, heat generating component 221 such as FET is mounted while being attached to heat sink 223. The heat generation of heat generating component 221 is thereby suppressed. Heat sink 223 is fixed to circuit substrate 217 with screws (not shown).

Connector 225 is mounted at the far left of circuit substrate 217 in FIG. 15. The terminal of connector 225 is mounted to be on the left side of circuit substrate 217. This will be specifically described hereinafter, but the terminal is mounted so as to be in the placing direction to the case of circuit substrate 217. Connector 225 is also partially fixed to circuit substrate 217 with screws (not shown). The illustration of other circuit components is omitted in FIG. 15.

Base part 227 for holding and fixing capacitor 211 and circuit substrate 217 will be described below. Base part 227 is formed by injection molding resin, and holder 229 of capacitor 211, circuit substrate fixing part 231, elastic projection 233, and the like are integrally formed.

First, holder 229 has a cylindrical shape to hold and fix capacitor 211. Cutout portion 235 is formed at one part of the cylindrical shape. Cutout portion 235 widens when capacitor 211 is placed in holder 229. As a result, capacitor 211 is subjected to elastic stress of holder 229, and thus can be securely held and fixed. According to such configuration, the tolerance of capacitor 211 and holder 229 is absorbed by cutout portion 235, capacitor 211 is reliably fixed, and reliability with respect to vehicle vibration is enhanced.

Circuit substrate fixing part 231 for fixing circuit substrate 217 will now be described. Circuit substrate fixing part 231 is integrally formed so as to project out in the vertical direction with respect to base part 227 from the vicinity of the lower end of base part 227. Circuit substrate fixing part 231 has a shape of sandwiching circuit substrate 217, where a catch portion (not shown) is arranged at the distal end. Since circuit substrate fixing part 231 has an elastically deformable shape, circuit substrate fixing part 231 deforms by the height of the catch portion when sandwiching circuit substrate 217 in circuit substrate fixing part 231, and the catch portion eventually fits into a hole (not shown) formed in circuit substrate 217. As a result, circuit substrate fixing part 231 returns to the original shape, and circuit substrate 217 is fixed to base part 227.

Therefore, capacitor 211 and circuit substrate 217 can be held and fixed on base part 227 as shown in FIG. 15 by placing capacitor 211 in holder 229 and sandwiching circuit substrate 217 to circuit substrate fixing part 231 simultaneously. Here, lead wire 213 is simply placed in lead wire hole 219, and thus needs to be held and fixed to base part 227 using a jig etc. (not shown) so that capacitor 211 does not move. Thereafter, each lead wire 213 is soldered to circuit substrate 217 so that lead wire 213 is electrically connected to circuit substrate 217. In this case, capacitor 211 is connected in series, in parallel, or in series parallel by the pattern on circuit substrate 217. In the fourth embodiment, the capacitor is connected in series. In time of soldering, capacitor 211 and circuit substrate 217 are already fixed to base part 227, and thus stress is not applied to the soldered portion of lead wire 213, and soldering reliability similar to the prior art is obtained.

Elastic projection 233 will be described below. Elastic projection 233 is the portion for fixing base part 227 fixed with circuit substrate 217 and a case to be hereinafter described, and has case fixing catch part 237 of tapered shape as shown in FIG. 15 integrally formed at the distal end. In the fourth embodiment, elastic projection 233 is formed on the top and bottom, and left and right of base part 227, and thus base part 227 and the case are fixed at four locations.

Case 239 for encapsulating circuit substrate 217 will now be described. Case 239 is formed by injection molding resin same as base part 227 so as to be formed to a shape shown on the left side in FIG. 15. Connector hole 241 for partially projecting the distal end of connector 225 from case 239 is integrally formed in case 239 to connect connector 225 to the external wiring (not shown). Connector hole 241 is larger than the outer dimension of connector 225, and is arranged on the surface (surface on left side in FIG. 15) opposite to circuit substrate placement part 243 of case 239. Connector 225 and the external wiring thus can be connected, and connector 225 can be arranged in the same plane as circuit substrate 217 mounted with capacitor 211, whereby lower height is realized.

Fixing part 247 for inserting circuit substrate end 245, and performing positioning and fixing of circuit substrate 217 in case 239 is arranged on both sides of circuit substrate placement part 243 on the inner wall of case 239, that is, on the inner wall on the near side and the far side of case 239 shown in FIG. 15. The details of fixing part 247 will be hereinafter described.

Lock part 249 which fits with case fixing catch part 237 arranged at the distal end of elastic projection 233 is also integrally formed in case 239 to fix base part 227. Lock part 249 is passed through, and the size thereof is slightly larger than case fixing catch part 237. Case fixing catch part 237 is thus reliably fitted to lock part 249, and case 239 and base part 227 are adequately fixed. Lock part 249 is arranged by the same number as elastic projection 233. Such number is four in the present embodiment, but may be appropriately increased or decreased according to the size etc. of base part 227 and case 239.

Figure 16:
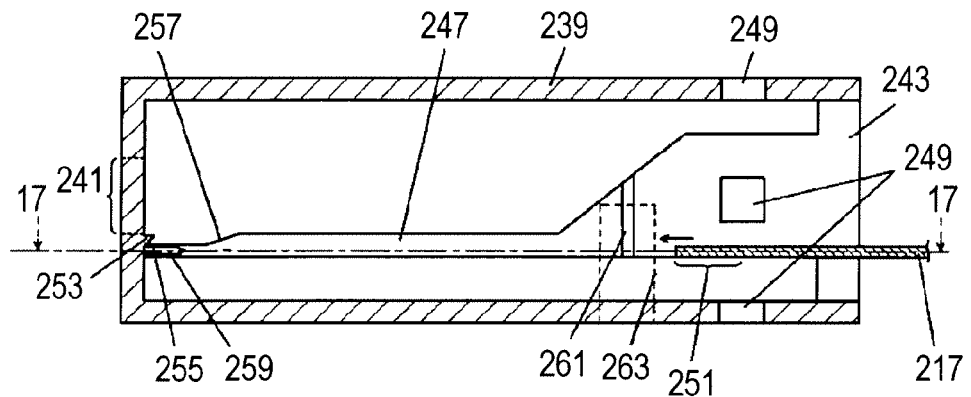
FIG. 16 is a partial cross sectional view in time of placing a circuit substrate to a case of the capacitor unit according to the fourth embodiment of the present invention.

Circuit substrate contacting portion 253 is integrally molded in case 239 so that one part of the side in the width direction (left side in FIG. 15) at distal end 251 in the inserting direction (direction of linear arrow in FIG. 15) contacts thereto when circuit substrate 217 is inserted into case 239. The detailed shape of circuit substrate contacting portion 253 is shown in FIG. 16. FIG. 16 is a cross sectional view of case 239 in chain dashed line of FIG. 15 showing a state in which circuit substrate 217 is inserted in the direction of the solid line arrow. As shown in FIG. 16, case inclined portion 255 is formed so that stress is applied in the vertical direction (downward direction in FIG. 16) on the side (left side) of circuit substrate 217 contacting circuit substrate contacting portion 253. Circuit substrate 217 is securely fixed by such stress with respect to the up and down direction of case 239. The fixed state of circuit substrate 217 at the completion of the capacitor unit will be hereinafter described.

The details of fixing part 247 will be described with reference to FIG. 16. The height of fixing part 247 is extremely high compared to the thickness of circuit substrate 217 on circuit substrate placement part 243 side and is given sufficient margin. Thus, circuit substrate 217 can be easily inserted to fixing part 247.

Fixing part 247 has a shape in which the height lowers in a step-wise manner towards the distal end (left direction in FIG.

16). In other words, the height of fixing part 247 is such that placement part of circuit substrate 217 is high and the distal end of fixing part 247 is low. Specifically, tapered portion 257 is formed on the near side of rib 259 to be hereinafter described in the vicinity of the distal end of the upper side or the lower side (upper side herein) of fixing part 247. Thus, when circuit substrate 217 is placed on fixing part 247, circuit substrate 217 is guided to the lower side of fixing part 247 by tapered portion 257, that is, the reference side for performing positioning of circuit substrate 217, so that circuit substrate 217 can be easily fixed at the normal position.

According to such configuration, positioning of circuit substrate 217 is completed when circuit substrate 217 is placed to the far side of fixing part 247, and thus connector 225 accurately projects out from connector hole 241 without contacting case 239. Therefore, application of stress on the soldered portion of connector 225 due to the contact of connector 225 to case 239 in time of assembly is prevented, and the reliability is enhanced.

Rib 259 is integrally formed at the portion contacting distal end 251 of circuit substrate 217 in fixing part 247. Rib 259 has a cross section of a triangle or a semicircle, and has the distal end thereof (right end of rib 259 in FIG. 16) formed to a tapered shape. Thus, when circuit substrate 217 is inserted to fixing part 247, distal end 251 of circuit substrate 217 goes over rib 259, so that circuit substrate 217 and case 239 are also securely fixed at the relevant portion. The details thereof will be described hereinafter.

Figure 17:
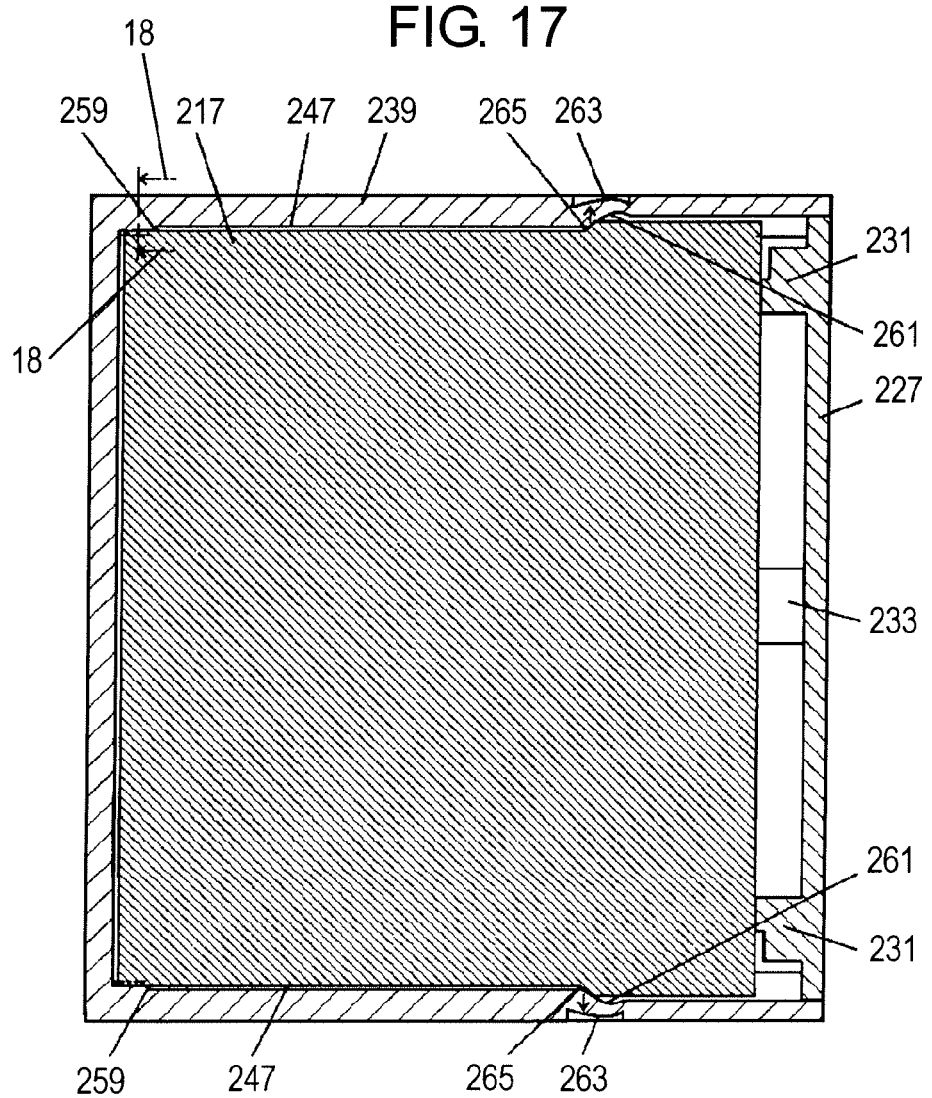
FIG. 17 is a cross sectional view at the center in the thickness direction of the circuit substrate at the completion of the capacitor unit according to the fourth embodiment of the present invention.

FIG. 17 is a cross sectional view seen from the direction of the arrow at the chain dashed line 17-17 of FIG. 16. A state in which circuit substrate 217 is inserted to case 239, and base part 227 is fixed to case 239 is shown. Case inclined portion 261 is arranged in fixing part 247. The spacing of fixing part 247 in the width direction of case 239 is further narrowed at case inclined portion 261. A depression may be formed on the outer surface of case 239 where case inclined portion 261 shown in FIG. 15 is positioned, so that thin thickness portion 263 is integrally formed in case 239. The near side of case inclined portion 261 in fixing part 247 (right side of case inclined portion 261 in FIG. 15) is the thinnest of the thickness of case 239.

Circuit substrate inclined portion 265 arranged at one part of circuit substrate end 245 contacts case inclined portion 261. Therefore, in circuit substrate 217, the width of circuit substrate 217 in the perpendicular direction with respect to the inserting direction (direction of arrow in FIG. 15) to fixing part 247 has a shape such that rear end 267 is wider than distal end 251 in the inserting direction. Therefore, when circuit substrate inclined portion 265 contacts case inclined portion 261, circuit substrate 217 is fixed to case 239 at the contacting portion as well. In FIG. 17, cross section of circuit substrate 217 at the center in the thickness direction is shown, but through holes and screw holes of circuit substrate 217, fixing holes etc. with base part 227, and the like are omitted.

The stress is applied to thin thickness portion 263 when circuit substrate inclined portion 265 contacts case inclined portion 261. Thin thickness portion 263 then bends and elastically deforms, whereby circuit substrate 217 can be securely held and fixed at a predetermined position. The deformed amount of thin thickness portion 263 is exaggerated in FIG. 17 to facilitate the understanding. Thin thickness portion 263 may be formed by depressing from the outer surface of case 239, so that thin thickness portion 263 will not run out of case 239 even when deformed, and degree of freedom of attachment to the vehicle of case 239 increases.

Figure 18:
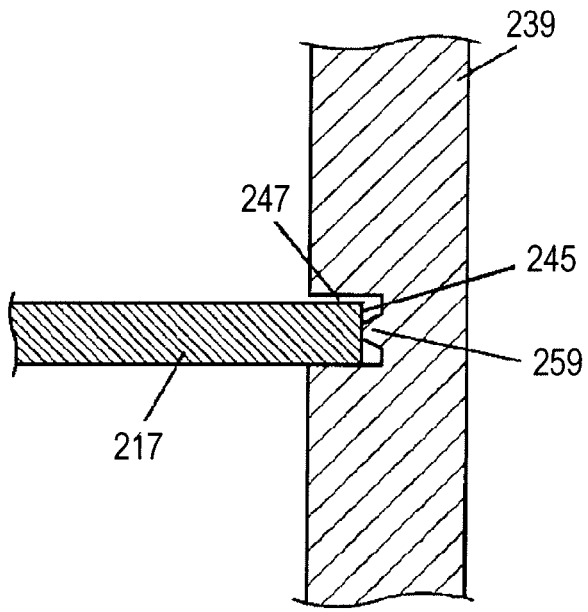
FIG. 18 is a cross sectional view of the rib formed in the case and the circuit substrate after assembly of the capacitor unit according to the fourth embodiment of the present invention.

FIG. 18 is a cross sectional view when seen from the direction of the arrow at the chain dashed line 18-18 in FIG. 17. In FIG. 18 as well, the components mounted on circuit substrate 217 are omitted. When circuit substrate 217 is inserted to fixing part 247, circuit substrate end 245 rides over rib 259, so that circuit substrate 217 and case 239 are securely held and fixed. In this case, circuit substrate 217 is guided to the normal position by tapered portion 257, and thus is securely fixed without causing displacement of circuit substrate 217. Tapered portion 257 is formed before rib 259 to perform fixation in such manner.

Since circuit substrate 217 is fixed to case 239 at four locations by rib 259 and thin thickness portion 263, circuit substrate 217 does not resonate with respect to the vehicle vibration in various directions applied to the capacitor unit, and an extremely high reliability is obtained.

The adhesive may be applied to the gap between base part 227 and case 239, case fixing catch part 237, fixing part 247, lock part 249, and the like to further ensure the fixation of base part 227 and case 239. In addition to secure fixation, dust proof and moisture proof effects are obtained at the portion applied with adhesive.

According to the above configuration, miniaturization and lower height are achieved by mounting capacitor 211 in the horizontal direction with respect to circuit substrate 217. The capacitor unit with high reliability by vibration resistance property in the up and down direction of circuit substrate 217 by circuit substrate contacting portion 253, and vibration resistance property in various directions of circuit substrate 217 by rib 259 and thin thickness portion 263 is realized.

Six capacitors 211 are used in the fourth embodiment, but the required quantity merely needs to be mounted according to the power specification of the vehicle to mount the capacitor unit.

In the fourth embodiment, capacitor 211 is described as being a cylindrical shape, but is not limited thereto, and may be a square column shape. In this case, corresponding holder 229 is formed to a tubular shape to match the shape of capacitor 211.

Fifth Embodiment

Figure 19:
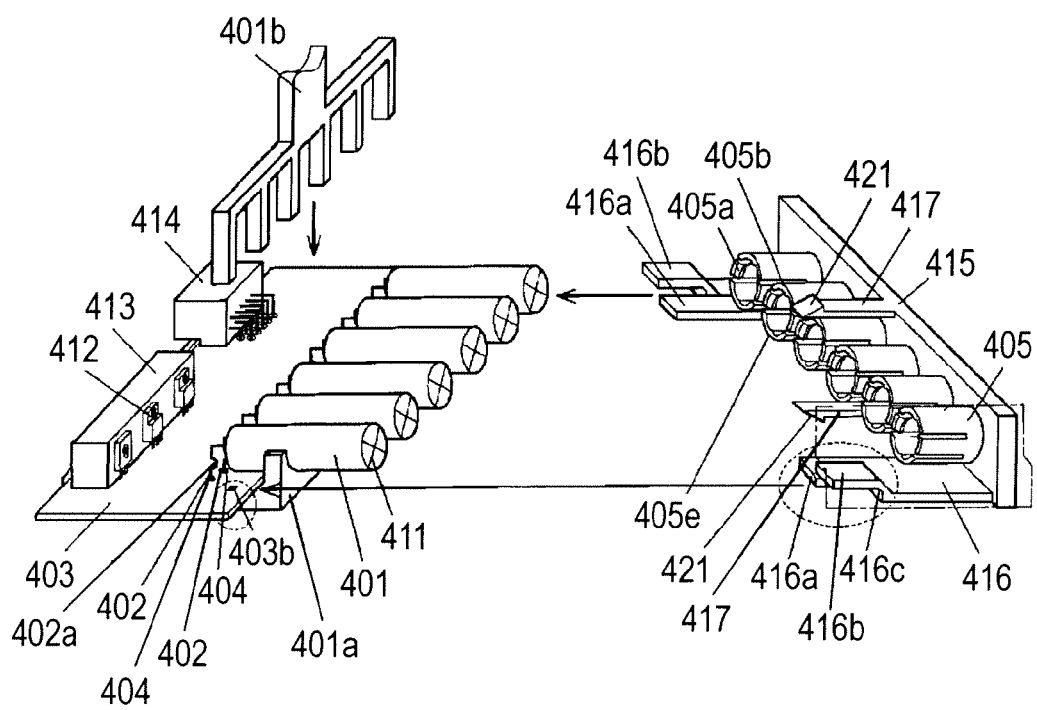
FIG. 19 is a partially exploded perspective view of a circuit substrate of a capacitor unit according to a fifth embodiment of the present invention.

FIG. 19 is a partially exploded perspective view of circuit substrate 403 of a capacitor unit according to a fifth embodiment of the present invention. In FIG. 19, plurality of capacitors 401 include electrical double layer capacitor of cylindrical shape. An example where the number of capacitor 401 is six is shown in the fifth embodiment. Two lead wires 402 are arranged at one end face (left side surface in FIG. 19) of each capacitor 401. Two lead wires 402 are bending worked in advance so that the polarities are in the same direction. That is, lead wire 402 in capacitor 401 of FIG. 19 is lined so that lead wire 402 on the near side (left side when seen from above capacitor 401) is positive pole, lead wire 402 on the far side (right side when seen from above capacitor 401) is negative pole. The distal end of lead wire 402 is performed with bending work so as to be perpendicular to the length direction of capacitor 401.

If the distal end of lead wire 402 is bent so as to be perpendicular to the length direction of capacitor 401, the polarity can always be distinguished, and thus lead wire 402 having different lengths depending on the polarity does not need to be left at the relevant length. The distal ends of two lead wires 402 are cut to a predetermined length in advance. The predetermined length is the length without excess or deficiency when capacitor 401 is mounted.

Bent portion 402a is arranged at one part of each lead wire 402 in the perpendicular direction (vertical direction in FIG. 19) with respect to the length direction of capacitor 401. Bent portion 402a is formed by performing bending work on lead wire 402 to a semicircular shape as in FIG. 19. The external stress of vehicle vibration etc. applied to lead wire 402 can be absorbed, and high reliability is obtained. The shape of bent portion 402a is not limited to a semicircle, and may be a "dogleg" shape and the like.

Explosion proof valve 411 for suppressing the event of rise in internal pressure is arranged at the distal end side (side surface without lead wire 402 of capacitor 401.

Capacitor 401 which lead wire 402 is worked is placed in lead wire hole 404 formed in circuit substrate 403 as shown on the left view in FIG. 19. According to such configuration, capacitor 401 is arranged in the horizontal direction with respect to circuit substrate 403, and thus miniaturization and lower height of the capacitor unit are achieved. In the fifth embodiment, the circuit components (excluding capacitor 401) for electrically controlling capacitor 401 such as the charging/discharging circuit, the state detection circuit, and the like are mounted on circuit substrate 403 in advance. Among them, heat generating component 412 such as FET is mounted while being attached to heat sink 413. The heat generation of heat generating component 412 is thereby suppressed. Heat sink 413 is fixed to circuit substrate 403 with screws (not shown).

Connector 414 is mounted on the extension in the length direction of capacitor 401 at the end of circuit substrate 403, that is, at the end on the left side of circuit substrate 403 in FIG. 19. The terminal of connector 414 is mounted so as to be on the left side of circuit substrate 403 in FIG. 19. This means that the terminal is mounted so as to be in the placing direction to the case of circuit substrate 403. Connector 414 is also partially fixed to circuit substrate 403 with screws (not shown). The illustration of other circuit components is omitted in FIG. 19.

The specific method of placing capacitor 401 to lead wire hole 404 will be described. As shown on the left view in FIG. 19, circuit substrate 403 is fitted to capacitor receiving jig 401a. Although not shown in FIG. 19, a depression is formed at positions corresponding to circuit components mounted on the back surface of circuit substrate 403 in capacitor receiving jig 401a so that circuit components mounted on the back surface of circuit substrate 3 are not influenced by stress etc. from capacitor receiving jig 401a.

When fitting capacitor 401 to capacitor receiving jig 401a, lead wire 402 is placed in respective lead wire hole 404. In this case, a semicircular depression slightly larger than the outer diameter of capacitor 401 is formed at six locations at the position corresponding to capacitor 401 in capacitor receiving jig 401a, and thus the position with respect to circuit substrate 403 of capacitor 401 can be substantially determined easily.

After arrangement of capacitor 401 is finished, capacitor back holding jig 401b is lowered in the direction of the arrow from above circuit substrate 403. Capacitor back holding jig 401b may be lowered by an electrical operation with an automatic machine or may be lowered by hand. Capacitor back holding jig 401b has a comb shape as shown in FIG. 19, where the width of each comb is worked to be slightly narrower than the spacing of two lead wires 402. Therefore, when capacitor back holding jig 401b finishes lowering to the front surface of circuit substrate 403, the comb portion respectively contacts the side surface on lead wire 402 side of capacitor 401. According to such jig, capacitor 401 can be positioned so that load is not applied on lead wire 402 even if not soldered to circuit substrate 403.

Base part 415 for holding and fixing capacitor 401 and circuit substrate 403 will be described below. Base part 415 is formed by injection molding resin, and holder 405 of capacitor 401, circuit substrate fixing part 416, elastic projection 417, and the like are integrally formed.

First, since capacitor 401 has a cylindrical shape, holder 405 similarly has a cylindrical shape as shown on the right side in FIG. 19. Cutout portion 405b is formed up to the middle in the cylindrical shape at four locations. The cylinder is thus divided into four portions, where the distal end of cutout portion 405b is made thick at two arbitrary opposing locations to form elastic portion 405a, and rib 405e is arranged in the length direction of the cylinder on at least one location of the remaining two locations. Therefore, holder 405 has a configuration in which elastic portion 405a lies along the outer periphery of capacitor 401 after placing capacitor 401.

The inner diameter of the cylindrical shape is formed to be slightly larger than the outer diameter of capacitor 401. Therefore, when capacitor 401 is placed in holder 405 using capacitor receiving jig 401a and capacitor back holding jig 401b from the direction of the arrow of FIG. 19, capacitor 401 is guided in the parallel direction with respect to the cylindrical shape while widening elastic portion 405a and contacting rib 405e. Therefore, capacitor 401 is securely held and fixed by the elasticity of elastic portion 405a while being positioned by rib 405e. According to such configuration, the tolerance of capacitor 401 and holder 405 is absorbed, and capacitor 401 can be reliably fixed. Cutout portion 405b is not particularly limited to four locations.

Figure 20:
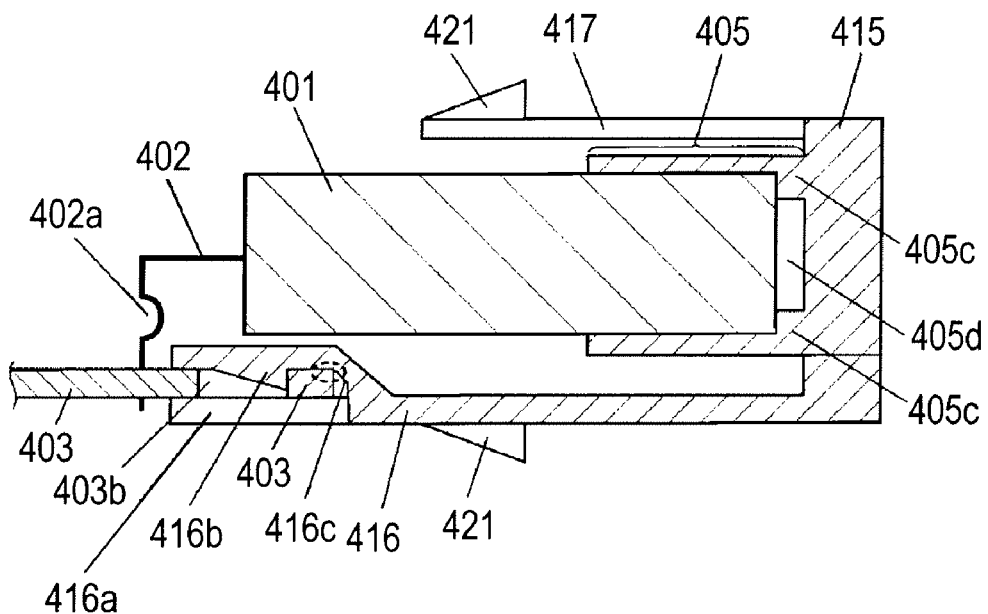
FIG. 20 is a partial cross sectional view of the base part and the circuit substrate after holding the capacitor of the capacitor unit according to the fifth embodiment of the present invention.

FIG. 20 is a cross sectional view of a chain dashed line portion in base part 415 of FIG. 19, and shows a state after placing capacitor 401 and circuit substrate 403 in base part 415 by the assembly step to be hereinafter described. Seat 405c, connected to elastic portion 405a, to which the distal end side of capacitor 401 contacts, is arranged in holder 405 as shown in FIG. 20 to prevent the distal end side of capacitor 401 from contacting base part 415 when placing capacitor 401 in holder 405. Furthermore, space 405d of concave shape is formed at the middle of seat 405c in seat 405c so that in the event explosion proof valve 411 operates, such operation is not inhibited. Capacitor 401 can be easily held at the normal position by placing the distal end side of capacitor 401 to elastic portion 405a until contacting seat 405c. When capacitor 401 is inserted to elastic portion 405a, explosion proof valve 411 on the distal end side of capacitor 401 exactly faces space 405d, and thus the operation of explosion proof valve 411 can be performed. Moreover, since the leaked electrolytic solution retains in space 405d, the electrolytic solution does not attach to the outer side of holder 405. If held such that the distal end side of capacitor 401 directly contacts base part 415, explosion proof valve 411 cannot operate, and thus the operation space of explosion proof valve 411 such as space 405d needs to be ensured. Therefore, the above structure is not limited as long as the operation space of explosion proof valve 411 can be ensured.

According to the structure of holder 405 described above, capacitor 401 is securely fixed at the normal position by simply inserting, and leakage of electrolytic solution is prevented, whereby reliability enhances.

Circuit substrate fixing part 416 for fixing circuit substrate 403 will be described in detail below. Circuit substrate fixing part 416 is integrally formed so as to project in the vertical direction with respect to base part 415 from the vicinity of the lower end of base part 415. Circuit substrate fixing projection 416a and circuit substrate fixing catch portion 416b are integrally formed with base part 415 so that extended portion in the length direction of circuit substrate fixing part 416 is arranged at the distal end of circuit substrate fixing part 416. The details of such portion will be described with reference to FIG. 20.

Circuit substrate fixing projection 416a and circuit substrate fixing catch portion 416b are arranged with a spacing substantially equal to the thickness of circuit substrate 403 in the height direction. Circuit substrate fixing catch portion 416b has elasticity, and tapered shape is formed at one part. The tapered shape is formed at the position to be fit with circuit substrate fixing hole 403b formed in circuit substrate 403 as shown in FIG. 20. Furthermore, inclined portion 416c that contacts the end (right end of circuit substrate 403 shown with an elliptical dotted line in FIG. 20) of circuit substrate 403 is arranged at the basal portion of circuit substrate fixing catch portion 416b.

Circuit substrate fixing catch portion 416b is arranged at the position corresponding to the vicinity of the end of circuit substrate 403 at the upper side of circuit substrate 403. Circuit substrate fixing catch portion 416b is arranged at the end (right front end and right back end in FIG. 19) of circuit substrate 403 as much as possible so as not to interfere with capacitor 401, whereby the spacing between circuit substrate fixing catch portion 416b and capacitor 401 can be narrowed by the relevant amount as shown in FIG. 20, and miniaturization and lower height can be realized.

Circuit substrate fixing projection 416a is larger than circuit substrate fixing catch portion 416b. This is so that circuit substrate fixing projection 416a functions to position circuit substrate 403, where if such portion is weak, the position of circuit substrate 403 may shift by external vibration etc. and affect the reliability. The thickness is increased in the present embodiment to have circuit substrate fixing projection 416a larger than circuit substrate fixing catch portion 416b, but the width may be widened, the length may be increased, or the above aspects may be combined.

When circuit substrate 403 is placed on circuit substrate fixing part 416, circuit substrate fixing projection 416a is arranged at the position not overlapping circuit substrate fixing hole 403b. That is, as shown in the right view in FIG. 19, circuit substrate fixing projection 416a and circuit substrate fixing catch portion 416b are arranged at positions shifted from each other. Thus, when circuit substrate 403 is placed on circuit substrate fixing part 416, whether or not circuit substrate fixing catch portion 416b is normally fitted into circuit substrate fixing hole 403b can be easily checked visually, and the reliably enhances.

Figure 21:
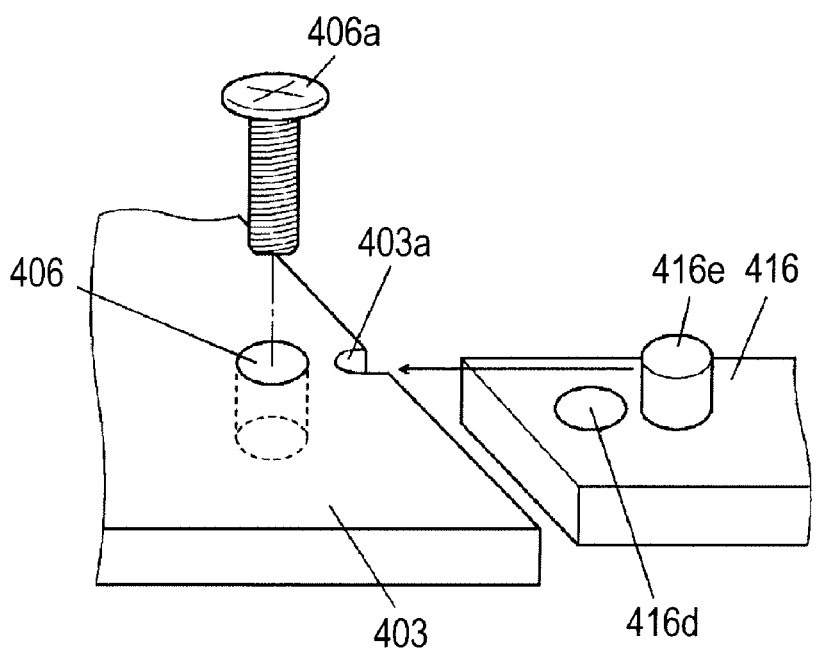
FIG. 21 is an enlarged perspective view of a circuit substrate fixing part of the capacitor unit of another configuration according to the fifth embodiment of the present invention, and a perspective view in screw-fitting the circuit substrate.

The portion shown with the elliptical dotted line of FIG. 19 in circuit substrate fixing part 416 has a configuration shown in FIG. 21. FIG. 21 is a perspective view in screw-fitting circuit substrate 403.

As shown in FIG. 21, positioning projection 416e is integrally formed on circuit substrate fixing part 416, and positioning concave part 403a is arranged at a position corresponding to positioning projection 416e in circuit substrate 403. When fixing circuit substrate 403 to circuit substrate fixing part 416, it is fixed with plurality of screws 406a with positioning projection 416e placed in positioning concave part 403a. The positioning of circuit substrate 403 is facilitated, and tightening of screw 406a is also facilitated since the positions of circuit substrate screw hole 406 formed in circuit substrate 403 and base part screw hole 416d formed in circuit substrate fixing part 416 coincide. Thus, the yield enhances and high reliability is obtained.

The configuration and effect of elastic projection 417 will now be described with reference to FIG. 19. Elastic projection 417 is the portion for fixing base part 415 fixed with circuit substrate 403 and case not shown) to be hereinafter described with reference to FIG. 23, where case fixing catch part 421 of taper shaped as shown on the right side of FIG. 19 is integrally formed at the distal end. In the fifth embodiment, elastic projection 417 is formed at two locations of upper and lower locations of base part 415, and thus base part 415 and case (not shown) 420 are fixed at two locations.

The above is the detailed structure of base part 415. A method of fixing circuit substrate 403 to base part 415 will be described.

First, in FIG. 19, circuit substrate 403 is placed between circuit substrate fixing projection 416a and circuit substrate fixing catch portion 416b in the direction of the arrow so that circuit substrate fixing catch portion 416b corresponds to circuit substrate fixing hole 403b of circuit substrate 403. Circuit substrate fixing catch portion 416b and circuit substrate fixing hole 403b formed at the position corresponding thereto thereby fit, and circuit substrate 403 and base part 415 are fixed as shown in FIG. 20. Here, since the distal end side of each capacitor 401 is respectively placed in holder 405 simultaneously with the fit-in, the fixation of capacitor 401 is also simultaneously performed. Capacitor 401 is positioned by capacitor receiving jig 401a, and fixed so as not to move when being placed to holder 405 by capacitor back holding jig 401b. Therefore, stress is not applied to lead wire 402 until placement of capacitor 401 to holder 405 is completed. Circuit substrate 403 and base part 415 can be fixed without applying stress to lead wire 402, and thus high reliability is obtained.

Capacitor 401 is securely fixed to holder 405 without applying stress to lead wire 402 by fixing circuit substrate 403 and base part 415 according to the assembly method described above, and thus does not need to be fixed with jig etc. Circuit substrate 403 is detached from capacitor receiving jig 401a after moving capacitor back holding jig 401b upward and detaching the same.

Figure 22:
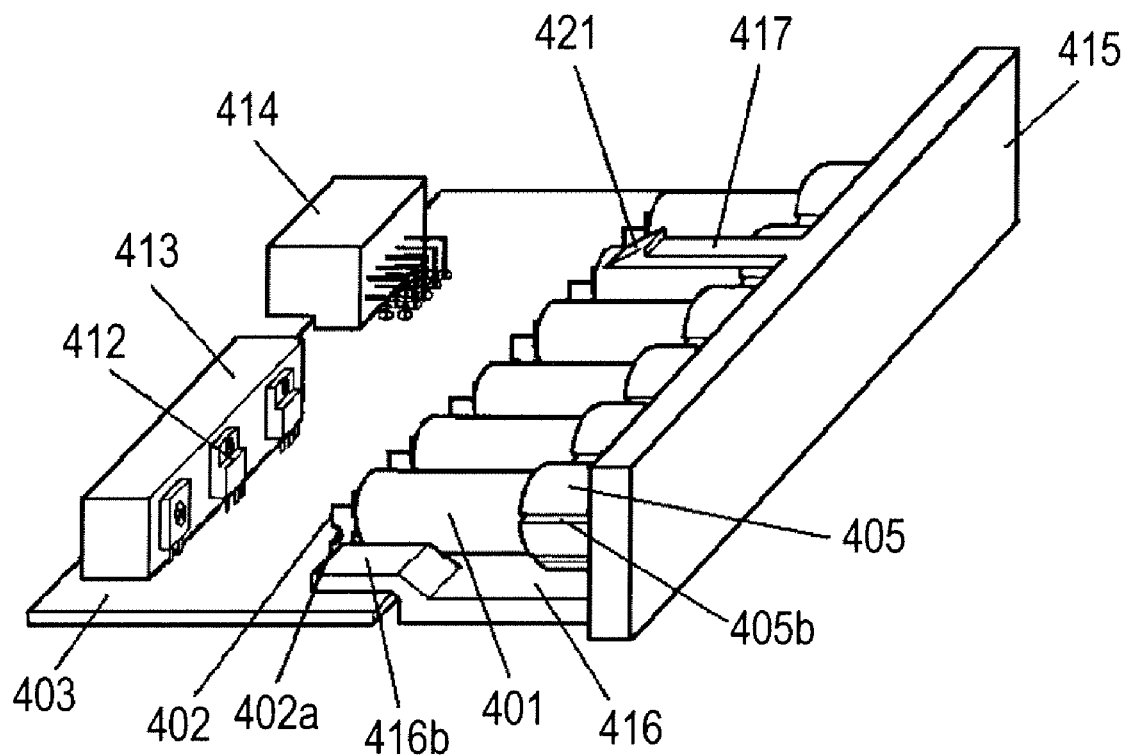
FIG. 22 is a perspective view of after an inner assembly of the capacitor unit according to the fifth embodiment of the present invention.

The state assembled up to now is shown in FIG. 22. FIG. 22 is a perspective view after inner assembly of the capacitor unit according to the fifth embodiment of the present invention. Capacitor 401 is sandwiched by holder 405, and circuit substrate 403 is sandwiched by circuit substrate fixing catch portion 416b and circuit substrate fixing projection 416a arranged on the back side of circuit substrate 403 shown in FIG. 19 to be respectively fixed to base part 415.

At this point, lead wire 402 of capacitor 401 is not soldered to circuit substrate 403, and thus circuit substrate 403 is turned back in the state of FIG. 22 to solder each lead wire 402. Lead wire 402 is then electrically connected to circuit substrate 403. Furthermore, since capacitor 401 and circuit substrate 403 are already fixed to base part 415 in this state, stress does not apply to the soldered portion of lead wire 402, and the soldering reliability similar to the prior art is obtained.

As each lead wire 402 is cut to a predetermined length in advance, the step of cutting lead wire 402 before soldering as in the prior art becomes unnecessary, and the productivity enhances.

A circuit pattern in which at least capacitor 401 is connected in series, in parallel, or in series parallel is formed on circuit substrate 403, and soldering is performed so that capacitor 401 is connected to be one of the above circuits. Six capacitors 401 are connected in series in the fifth embodiment.

Circuit substrate 403 is encapsulated in case (not shown), where the method thereof is the same as the methods described in the first to the fourth embodiments, and thus the details will be omitted.

Six capacitors 401 are used in the fifth embodiment, but the required quantity merely needs to be mounted according to the power specification of the vehicle to mount the capacitor unit.

In the assembly method, a configuration of fixing circuit substrate 403 to base part 415 after first placing capacitor 401 to holder 405 can also be considered, but in the case of the fifth embodiment, circuit substrate 403 needs to be fixed to base part 415 while simultaneously placing a great number or twelve lead wires 402 in lead wire holes 404. Thus, assembly becomes extremely complicating, and stress may be applied on lead wire 402 when placing lead wire 402 in lead wire hole 404. Therefore, a step of placing in holder 405 after making capacitor 401 immovable with capacitor back holding jig 401b becomes necessary after positioning capacitor 401 with respect to circuit substrate 403 using capacitor receiving jig 401a in advance as described in the fifth embodiment.

In the fifth embodiment, capacitor 401 is described as being a cylindrical shape, but is not limited thereto, and may be a square column shape etc. In this case, corresponding holder 405 is made to a tubular shape to match the shape of capacitor 401.

INDUSTRIAL APPLICABILITY

The capacitor unit according to the present invention is miniaturized and the height is lowered since the capacitor is mounted in the horizontal direction with respect to the upper space of the circuit substrate, and furthermore, the formation of the moisture proof agent on both surfaces of the circuit substrate is facilitated in time of assembly of the capacitor unit. Therefore, a configuration having an extremely satisfactory productivity is obtained, and in particular, the present invention is useful as an emergency power source etc. used in the electronic brake system and the like for electrically braking the vehicle.

The invention claimed is:

1. A capacitor unit comprising:
   a plurality of capacitors, each of which having a lead wire on one end face;
   a circuit substrate for connecting the capacitors in series, in parallel, or in series parallel;
   a capacitor connection pin for connecting the capacitors mounted on the circuit substrate;
   a moisture proof agent on the circuit substrate mounted with the capacitor connection pin;
   a base part integrally formed with a holder for holding the other end face sides not including the lead wire of a capacitor and a circuit substrate fixing part for fixing the circuit substrate; and
   a case for encapsulating the circuit substrate; wherein
   the capacitor unit is within a case
      with the other end face sides of the capacitors held by the holder,
      the circuit substrate is fixed to the circuit substrate fixing part, and
      the lead wires of the capacitors and the capacitor connecting portion of the capacitor connection pin are connected.

2. The capacitor unit according to claim 1, wherein the holder includes an elastic portion along an outer periphery of the capacitor.

3. The capacitor unit according to claim 1, wherein the holder has a shape whereby the other end face sides of the capacitors do not contact the base part;
   a seat to which the other end face side of the capacitor contacts is arranged at the holder; and
   the seat includes a space of concave shape.

4. The capacitor unit according to claim 1, wherein
   a snap is integral with the circuit substrate fixing part;
   a circuit substrate fixing hole is at the circuit substrate; and
   when the circuit substrate is fixed to the circuit substrate fixing part, the circuit substrate and the circuit substrate fixing part are connected by the snap fitted into the circuit substrate fixing hole.

5. The capacitor unit according to claim 1, further comprising:
   an integrated capacitor connection pin comprising the resin-molded plurality of capacitor connection pins at the lower end of intermediate portions thereof excluding a circuit substrate placement portion and the capacitor connecting portion of the capacitor connection pin.

6. The capacitor unit according to claim 1, wherein
   a plurality of elastic projections having a case fixing catch part at a distal end on the base part;
   a plurality of lock parts larger than the case fixing catch part in the case; wherein
   the case fixing catch part fits with the lock part to fix the base part and the case.

7. The capacitor unit according to claim 1, wherein
   a connector is on an extension in a length direction of the capacitor at an end of the circuit substrate so that a terminal is positioned in a placing direction to the case of the circuit substrate;
   a connector hole larger than an outer dimension of the connector at a surface opposite to a base part placement port of the case; and
   a groove for placing the circuit substrate is on a wall face on both sides of the base part placement port.

8. The capacitor unit according to claim 1, wherein when the circuit substrate is in the case, one side of the circuit substrate most distant from the base part contacts a circuit substrate contacting portion in the case.

9. The capacitor unit according to claim 1, wherein
   the capacitors are horizontal, and a fixing part for inserting and fixing an end of the circuit substrate is on both sides at an inner wall of the case;
   a circuit substrate inclined portion is at one part of the end so that a width of the circuit substrate in a perpendicular direction with respect to an inserting direction of the circuit substrate to the fixing part is wider at a rear end than at a distal end in the inserting direction;
   a case inclined portion which contacts the circuit substrate inclined portion at a position facing the circuit substrate inclined portion; and
   a thin thickness portion at the case inclined portion.

10. The capacitor unit according to claim 9, wherein the thin thickness portion is at a depression on an outer surface of the case.

11. A capacitor unit comprising:
   a plurality of capacitors, each having a lead wire on one end face;
   a circuit substrate for connecting the capacitors in series, in parallel, or in series parallel;
   two lead wires on the one end face of each capacitor, bent so that distal ends of the lead wires are perpendicular to a length direction of the capacitors to provide respective polarity in the same direction, and in a lead wire hole at the circuit substrate;

a base part integral with a tubular holder for holding the other end face side not including the lead wires of the capacitors and a circuit substrate fixing part for fixing the circuit substrate; and a case for encapsulating the circuit substrate; wherein the capacitor unit in the case from the circuit substrate side
  with a distal end side of the other end face of the capacitors held by the holder,
  the circuit substrate fixed to the circuit substrate fixing part, and
  the circuit substrate and each lead wire connected.

12. The capacitor unit according to claim 11, wherein the holder includes an elastic portion along an outer periphery of the capacitor.

13. The capacitor unit according to claim 11, wherein
the holder has a shape whereby the distal end face sides of the capacitors do not contact the base part;
a seat which the distal end face side of the capacitors contacts is at the holder; and
the seat includes a space of concave shape.

14. The capacitor unit according to claim 11, wherein
a plurality of elastic projections having a case fixing catch part at a distal end is on the base part;
a plurality of lock parts larger than the case fixing catch part is in the case; and
the case fixing catch part fits with the lock part when the base part is in the case to fix the base part and the case.

15. The capacitor unit according to claim 11, wherein
a connector is on an extension in a length direction of the capacitor at an end of the circuit substrate so that a terminal is in a placing direction to the case of the circuit substrate;
a connector hole larger than an outer dimension of the connector is at a surface opposite to a base part placement port of the case; and
a groove for placing the circuit substrate is on a wall face on both sides of the base part placement port.

16. The capacitor unit according to claim 11, wherein when the circuit substrate is in the case, one side of the circuit substrate most distant from the base part contacts a circuit substrate contacting portion in the case.

17. The capacitor unit according to claim 11, wherein
the capacitors are horizontal, and a fixing part for inserting and fixing an end of the circuit substrate is on both sides at an inner wall of the case;
a circuit substrate inclined portion is at one part of the end so that a width of the circuit substrate in a perpendicular direction with respect to an inserting direction of the circuit substrate to the fixing part is wider at a rear end than at a distal end in the inserting direction;
a case inclined portion which contacts the circuit substrate inclined portion is at a position facing the circuit substrate inclined portion; and
a thin thickness portion is at the case inclined portion.

18. The capacitor unit according to claim 17, wherein the thin thickness portion is in a depression on an outer surface of the case.

* * * * *